(12) United States Patent
Wu et al.

(10) Patent No.: US 8,933,738 B2
(45) Date of Patent: Jan. 13, 2015

(54) SIGNAL DUTY CYCLE DETECTOR AND CALIBRATION SYSTEM

(71) Applicant: MediaTek Singapore Pte. Ltd., Singapore, CA (US)

(72) Inventors: I-Chang Wu, Fremont, CA (US); Alireza Shirvani-Mahdavi, San Jose, CA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/723,636

(22) Filed: Dec. 21, 2012

(65) Prior Publication Data

US 2013/0229216 A1 Sep. 5, 2013

Related U.S. Application Data

(60) Provisional application No. 61/606,614, filed on Mar. 5, 2012, provisional application No. 61/606,607, filed on Mar. 5, 2012.

(51) Int. Cl.
  *H03K 3/017* (2006.01)
  *H03K 5/04* (2006.01)
  *H03K 7/08* (2006.01)
  *H03K 5/06* (2006.01)
  *H03K 5/156* (2006.01)

(52) U.S. Cl.
  CPC .............. *H03K 5/06* (2013.01); *H03K 5/1565* (2013.01)
  USPC .......................................... 327/175; 327/261

(58) Field of Classification Search
  USPC ................. 327/141, 144–163, 175; 331/1/A, 331/15–17; 375/373–376
  See application file for complete search history.

(56) References Cited

U.S. PATENT DOCUMENTS

| | | | |
|---|---|---|---|
| 5,451,893 A | 9/1995 | Anderson | |
| 6,940,328 B2* | 9/2005 | Lin | 327/175 |
| 6,967,514 B2 | 11/2005 | Kizer et al. | |
| 7,378,893 B1* | 5/2008 | Kang | 327/291 |
| 7,403,055 B2 | 7/2008 | Minzoni | |
| 7,525,359 B2 | 4/2009 | Kim | |
| 7,633,324 B2 | 12/2009 | Yun et al. | |
| 7,705,647 B2 | 4/2010 | Dai et al. | |
| 7,944,262 B2* | 5/2011 | Kuroki et al. | 327/175 |
| 2008/0191767 A1* | 8/2008 | Koo | 327/175 |
| 2009/0289679 A1* | 11/2009 | Kuroki et al. | 327/175 |
| 2009/0322390 A1 | 12/2009 | Shim | |
| 2010/0127733 A1* | 5/2010 | Kikuchi | 327/31 |
| 2010/0237917 A1* | 9/2010 | Monma | 327/158 |
| 2011/0227623 A1* | 9/2011 | Koo | 327/175 |
| 2011/0273211 A1* | 11/2011 | Chang et al. | 327/175 |

* cited by examiner

*Primary Examiner* — Brandon S Cole
(74) *Attorney, Agent, or Firm* — Sawyer Law Group, P.C.

(57) ABSTRACT

A duty cycle detector and calibration system is disclosed. In some embodiments, a duty cycle calibration system includes a first tuning circuit operative to receive an input signal, tune a duty cycle of the input signal to within a first error range, and provide a first output signal. A second tuning circuit tunes a duty cycle of the first output signal to within a second error range and provides a second output signal, where the second error range has more precision than the first error range. A duty cycle detector provides a duty cycle detection signal indicative of a duty cycle of the second output signal, and logic controls the first and second tuning circuits based upon the duty cycle detection signal.

20 Claims, 18 Drawing Sheets

US 8,933,738 B2

SIGNAL DUTY CYCLE DETECTOR AND CALIBRATION SYSTEM

CROSS-REFERENCE TO RELATED APPLICATIONS

This application claims benefit under 35 USC 119(e) of Provisional Patent Application No. 61/606,607, filed on Mar. 5, 2012, and Provisional Patent Application No. 61/606,614, filed on Mar. 5, 2012, all of which are incorporated hereby by reference in their entireties.

FIELD OF THE INVENTION

The present inventions relate to signal calibration for electronic circuits, and more particularly to detecting and calibrating a duty cycle of a signal.

BACKGROUND OF THE INVENTION

Precise signals are typically required in modern circuits to accurately time circuits, sample data, and perform other functions. As the speed and performance of electronic devices increases, so does the need for accurate high-frequency clock and data signals. For example, the rising and/or falling edges of a clock signal may need to be accurately aligned with data signals to allow accurate sampling of data.

To ensure accurate signals, calibration may be performed on the signals to properly align the signal edges and adjust the duty cycle to the desired ratio. However, many previous duty cycle calibration systems can be limited in accuracy or degree of calibration allowed, as well as being inflexible in different applications.

SUMMARY OF THE INVENTION

Detection and calibration of a signal duty cycle is described. In some embodiments, a duty cycle calibration system includes a first tuning circuit operative to receive an input signal, tune a duty cycle of the input signal to within a first error range, and provide a first output signal. A second tuning circuit receives the first output signal, tunes a duty cycle of the first output signal to within a second error range, and provides a second output signal, where the second error range has more precision than the first error range. A duty cycle detector receives the second output signal and provides a duty cycle detection signal indicative of a duty cycle of the second output signal, and logic controls the first tuning circuit and the second tuning circuit based upon the duty cycle detection signal.

In some embodiments, a duty cycle calibration system includes a coarse tuning circuit that receives an input signal, tunes a duty cycle of the input signal closer to a target duty cycle, and output a tuned output signal. The tuned output signal is based on a combination of the input signal and a delayed signal that has been delayed relative to the input signal. A duty cycle detector receives the tuned output signal and provides a duty cycle detection signal indicative of a duty cycle of the tuned output signal. Logic controls the coarse tuning circuit based upon the duty cycle detection signal.

In some embodiments, a duty cycle calibration system includes a fine tuning circuit that receives an input signal, tunes a duty cycle of the input signal closer to a target duty cycle, and provides a tuned output signal. The tuning of the duty cycle includes changing an impedance in the fine tuning circuit to change the rise time or fall time of edges of the tuned output signal. A duty cycle detector receives the tuned output signal and provides a duty cycle detection signal indicative of a duty cycle of the tuned output signal. Logic controls the fine tuning circuit based upon the duty cycle detection signal.

In some embodiments, a duty cycle detector includes a capacitor having a first terminal and a second terminal. Multiple switches are coupled to the capacitor, where the switches open and close responsive to an input signal to cause the first terminal and the second terminal to charge and discharge. A comparator is coupled to the first and second terminals and outputs a signal indicative of the duty cycle of the input signal.

DETAILED DESCRIPTION

Embodiments described herein relate to signal calibration for electronic circuits, and more particularly to detecting and calibrating a duty cycle of a signal. Various modifications to the described embodiments and the generic principles and features described herein will be readily apparent to those skilled in the art. Thus, the embodiments herein are not intended to be limited to the examples shown but is to be accorded the widest scope consistent with the principles and features described herein.

These embodiments are mainly described in terms of particular systems and methods provided in particular implementations. However, one of ordinary skill in the art will readily recognize that these systems and methods will operate effectively in other implementations. For example, system implementations usable with the present embodiments can take a number of different forms. The present embodiments will also be described in the context of particular methods having certain steps. However, the methods and systems operate effectively for other methods having different and/or additional steps not inconsistent with these embodiments.

In some previous duty cycle calibration systems, a duty cycle can be adjusted by using a feedback loop to provide a control signal to a set of series-connected delay resistors, where a number of the delay resistors are selected to be included in the signal path to delay the signal a particular amount and adjust the duty cycle. Comparators and an accumulator may be used for determining whether to increase or decrease the duty cycle with the control signal. However, such systems and their components can be inaccurate, inflexible, or otherwise limited in many different applications.

In contrast, embodiments and features described herein allow accurate and flexible calibration of the duty cycle of a signal. For example, some embodiments of a calibration circuit provide use of a coarse tuning circuit and a fine tuning circuit, which allows large imbalances in duty cycle to be precisely calibrated as well as offering flexibility on the use of coarse or fine calibration in particular applications. Embodiments of a coarse tuning circuit can provide a calibrated output signal based on a combination of an input signal and a delayed signal and can correct for large corrections in duty cycle. Embodiments of a fine tuning circuit can provide precise adjustment of duty cycle based on changing the rise time or fall time of edges in a calibrated output signal. Some embodiments of a duty cycle detector described herein allow implementations of lower cost and complexity and greater reliability than many previous designs, as well as detection of a programmable duty cycle.

To more particularly describe the features of the disclosed embodiments, please refer to FIGS. 1-22 in conjunction with the discussion below.

Figure 1:
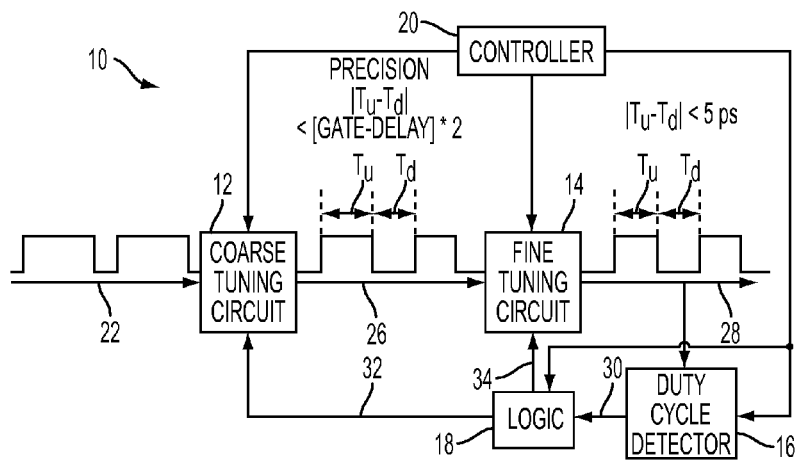
FIG. 1 is a block diagram of one embodiment of a duty cycle calibration system including one or more features described herein.

FIG. 1 is a block diagram of one embodiment of a duty cycle calibration system 10. The system 10 can be implemented in any electronic device, computer system, subsystem for a device or computer, or similar apparatus. For example, the system 10 can be used in a timing circuit that samples data from an incoming signal, such as a crystal oscillator, clock generator, or external clock.

System 10 can include a coarse tuning circuit 12, a fine tuning circuit 14, a duty cycle detector 16, logic 18, and controller 20. In some embodiments, both coarse tuning circuit 12 and fine tuning circuit 14 are included in system 10, while in other embodiments only one of these tuning circuits is included in the system. In still other embodiments, both tuning circuits 12 and 14 are included in system 10, but one of the tuning circuits is disabled. For example, a user or controller 20 may be able to selectively enable and disable each circuit 12 and 14 in some embodiments.

Coarse tuning circuit 12 receives an input signal 22. In some embodiments, the input signal 22 is a clock signal which may need duty cycle calibration. The coarse tuning circuit 12 performs larger adjustments in the duty cycle of the signal to cause the duty cycle to become closer to a desired target duty cycle, and has a larger error range than the fine tuning circuit 14. For example, the coarse tuning circuit 12 can be used to calibrate seriously unbalanced input signals which have been subject to larger distortion or interference. In some embodiments, the coarse tuning circuit 12 can be disabled or the input signal can otherwise be controlled to bypass the adjustments performed by the coarse tuning circuit 12 if no such larger adjustment is needed for the signal. In some embodiments, this bypass can be controlled by the controller 20 based on the duty cycle of the signal as detected by the duty cycle detector 16.

The coarse tuning circuit 12 outputs a calibrated coarse tuning output signal 26. As shown in the example of FIG. 1, the precision of the coarse tuning can in some embodiments be expressed in terms of the time $T_u$ of the up pulse of the output signal 26 and the time $T_d$ of the down pulse of the calibrated output signal 26. In this example, a 50% duty cycle is the desired target duty cycle and so the precision of the coarse tuning circuit 12 is the difference between time $T_d$ and time T. In the example shown, this precision is less than two gate delays, where a gate delay is the delay of the signal resulting from pass through a gate of the coarse tuning circuit 12. Thus the coarse tuning circuit 12 can adjust a signal to a target duty cycle within a tolerance of two gate delays. Such gate delays are described in greater detail below.

The fine tuning circuit 14 receives the calibrated output signal 26 from the coarse tuning circuit 12. The fine tuning circuit 14 adjusts the duty cycle of the signal 26 closer to the target duty cycle to a more precise degree than the coarse tuning circuit 12, e.g., within a more precise error range than the error range of the coarse tuning circuit, and outputs a calibrated fine tuning output signal 28. For example, the precision of the fine tuning circuit 14 can be expressed in some embodiments as the difference between time $T_d$ and time $T_u$, and in the example shown, is less than 5 picoseconds. Other degrees of fine tuning precision can be provided in other embodiments or other circuits, based on desired requirements. The calibrated output signal 28 can be provided to components in an electronic device or system as a signal having a calibrated duty cycle. In some embodiments, the signal 28 is output to such components after the duty cycle has been calibrated through one or more iterations of the fine tuning circuit 14 to adjust the duty cycle to the target duty cycle.

Duty cycle detector 16 receives the calibrated output signal 28 and detects the current duty cycle of that signal. The detector 16 outputs a duty cycle detection signal 30 that is indicative of the detected duty cycle. Examples for some embodiments of a duty cycle detector 16 are described below with reference to FIGS. 14 to 22.

Logic 18 receives the duty cycle detection signal 30 and, based on this signal, provides a coarse control signal 32 to the coarse tuning circuit 12 and/or a fine control signal 34 to the fine control circuit 14. These control signals cause the tuning circuits 12 and/or 14 to adjust their tuning process (if needed) to cause the duty cycle of their output signals to be closer to the target duty cycle. Thus, in a close-loop feedback path, the duty cycle detector 16 detects a current duty cycle of the output signal 28 and outputs a signal 30 to cause logic 18 to further adjust the duty cycle closer to the target duty cycle based on the current duty cycle of the signal 28.

In some embodiments having both a coarse tuning circuit and a fine tuning circuit, the logic 18 can first adjust the duty cycle of the input signal using coarse tuning circuit 12 to attain the highest degree of calibration precision of the coarse tuning circuit. Then, the logic 18 can enable the fine tuning circuit 14 to further adjust the duty cycle of the signal to the precision allowed by the fine tuning circuit 14. One example method for tuning a duty cycle using both circuits 12 and 14 is described below with reference to FIG. 2. This combination can be advantageous, in one example, when the input signal 22 has been subject to a large imbalance or distortion, resulting in a duty cycle which is so different from the target duty cycle that it may be beyond the capability of the fine tuning circuit 14 to correct. However, this duty cycle can be corrected by the coarse tuning circuit 12 to within a degree of precision that then allows the fine tuning circuit 14 to correct the duty cycle to within a finer precision.

Controller 20 can be provided in an electronic device or other system that includes the duty cycle calibration system 10. The controller 20 can receive signals indicating the status of various components or signals of the system 10, and can output signals to control components of the system. For example, the controller 20 can output signals 36 and 38 to the coarse tuning circuit 12 and fine tuning circuit 14, respectively, to enable or disable the operation of those circuits. In one example, the controller 20 may be programmed to disable one of the circuits 12 or 14 since it is unneeded for a current application. The controller 20 may also set programmable parameters of the circuit 12, circuit 14, duty cycle detector 16, and/or logic 18 to adjust performance to a desired specification. In some embodiments, processor 20 can be (or include) any processing circuit that can perform desired functions and calculations for the system 10, such as one or more microprocessors, CPUs, programmable devices or circuits, logic gates, etc. Memory (not shown) can also be provided to store parameters, data, or other needed information.

Figure 2:
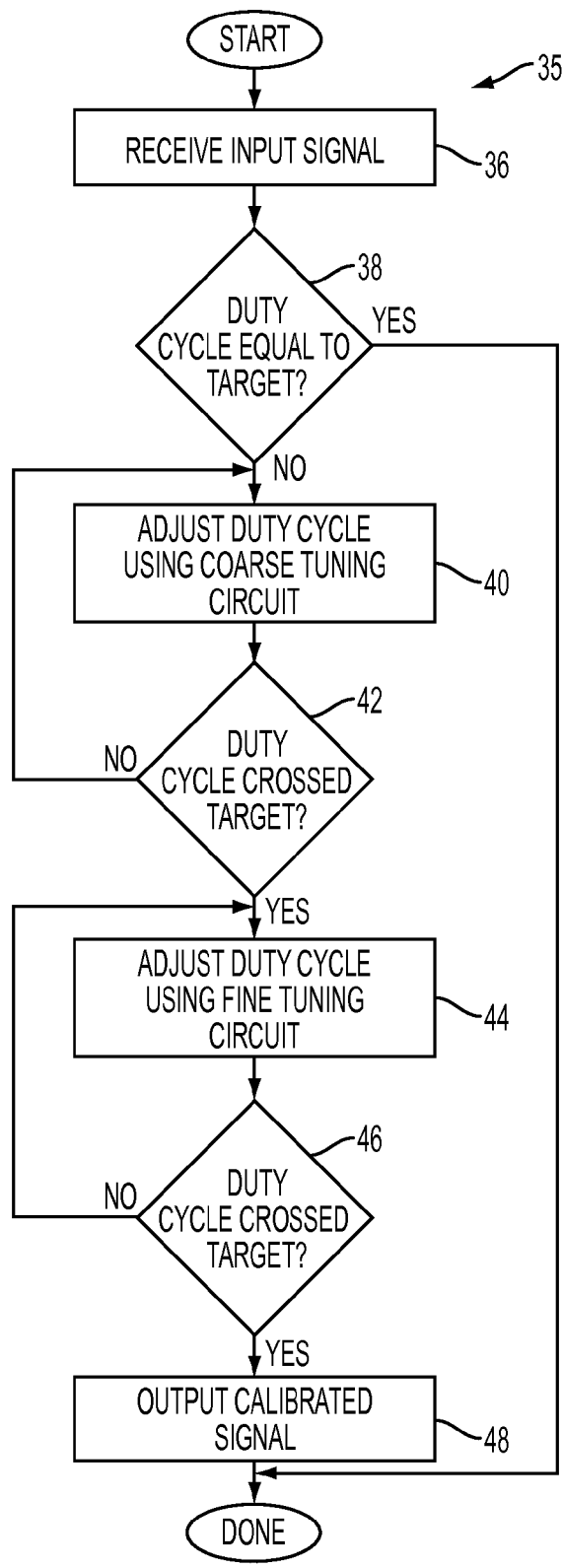
FIG. 2 is a flow diagram illustrating an example method for calibrating the duty cycle of a signal using a coarse tuning circuit and a fine tuning circuit as described herein.

FIG. 2 is a flow diagram illustrating an example method 35 for calibrating the duty cycle of a signal using a coarse tuning circuit 12 and a fine tuning circuit 14 as described herein. Method 35 can be implemented using the circuits 12 and 14 as well as using logic 18 and/or a controller 20 as shown in FIG. 1. Some embodiments can implement portions of the method 35 (and any of the methods described herein) in software or firmware to control circuit components. Such software can be implemented in computer program product accessible from a computer readable medium, such as a storage medium storing program instructions executable by a processor. Such a storage medium can include an electronic, magnetic, optical, electromagnetic, infrared, or semiconductor medium, such as semiconductor or solid state memory, magnetic tape, a removable computer diskette, a random access memory (RAM), a read-only memory (ROM), flash memory, a rigid magnetic disk, an optical disk, and a solid-state memory drive.

The method begins at step 36, where an input signal 22 is received. In step 38, the process checks whether the duty cycle of the received signal is equal to the target duty cycle. This can be checked using the duty cycle detector 16, for example. This received signal can be the input signal 22 passed through both the coarse tuning circuit 12 and the fine tuning circuit 14 without adjusting the duty cycle. If the duty cycle is equal to the target duty cycle, the signal requires no calibration and the process is complete.

If the duty cycle is not equal to the target duty cycle, then in step 40 the duty cycle of the input signal is adjusted using the coarse tuning circuit. For example, if the duty cycle is over the target duty cycle, the duty cycle of the input signal is decreased, or if the duty cycle is under the target duty cycle, the duty cycle of the input signal is increased. An example method for coarse tuning the duty cycle is described below with reference to FIG. 4. At this stage, the fine tuning circuit 14 can remain disabled such that the coarse tuning output signal 26 passes through without any fine adjustment to its duty cycle.

In step 42, the process checks whether the duty cycle of the received coarse tuning output signal 26 has crossed the target duty cycle threshold. For example, if the duty cycle was previously above the target duty cycle, and is now below the target duty cycle, it has crossed this threshold. Similarly, it the signal's duty cycle was previously below and is now above the target duty cycle, it has crossed the threshold. If it has not crossed the threshold, then the process returns to step 40 to further adjust the duty cycle using the coarse tuning circuit 12 in another iteration. If it has crossed the threshold, then in next step 44 the duty cycle is adjusted further using the fine tuning circuit. An example method for fine tuning the duty cycle is described below with reference to FIG. 6. At this stage, the coarse tuning circuit 12 can remain at its last-tuned state and is not further adjusted.

In step 46, the process checks whether the duty cycle of the received fine tuning output signal 28 has crossed the target duty cycle threshold. If it has not crossed the threshold, then the process returns to step 44 to further adjust the duty cycle using the fine tuning circuit 14 in another iteration. If it has crossed the threshold, then the calibrated output signal 28 can be output to components of the system in step 48 and the process is complete. In some embodiments, the process can return to step 38 to continue checking the duty cycle of the calibrated output signal 28.

If in some embodiments there is no use of the coarse tuning circuit 12 or the fine tuning circuit 14, then the steps of the method 35 pertaining to the unused circuit can be omitted.

Figure 3A:
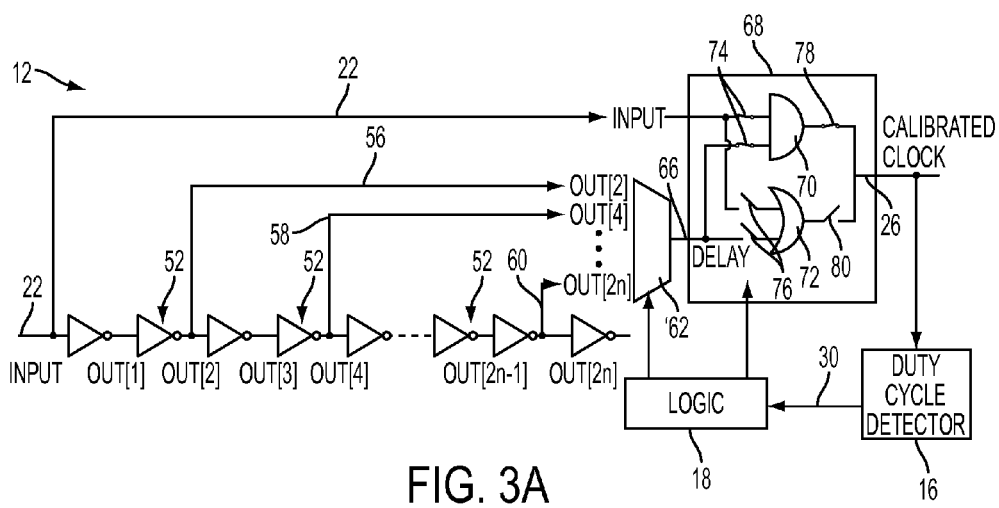
FIGS. 3A and 3C are schematic illustrations of one example embodiment of a coarse tuning circuit of FIG. 1.

FIG. 3A is a schematic illustration of one example embodiment of a coarse tuning circuit 12 of FIG. 1. An input signal 22 is provided to be calibrated by the circuit 12, and can be a clock signal in some embodiments. Input signal 22 is provided to a chain of gates connected in series, where a number of the gates are in the path of the input signal to provide a corresponding delay. The gates are implemented as inverters 52 in the example embodiment of FIG. 3A, where each pair of inverters outputs the same signal state after the signal has been inverted twice. An inverter output signal is output after each pair of inverters 52 (or after a subset of the pairs). For example, an inverter output line 56 is provided after the first two inverters, an inverter output line 58 is provided after the next two inverters, and so on, until the last output line 60 which is provided after 2n inverters. The variable n is the number of inverter output signals provided from the series of inverters 52, i.e., the number of different selectable delays in the circuit 12. One of these inverter outputs is selected for use, as described below.

The n signal lines connected to the inverters 52 are input to a multiplexer 62. For example, the signal Out[2] is provided on the inverter output line 56 that is connected after the first two inverters 52 of the series and is connected as one of the inputs of the multiplexer 62. Similarly, the signal Out[4] on the inverter output line 58 is connected after the first four inverters 52 and is another one of the inputs of the multiplexer 62 of the series. Thus the total delay on the signal Out[4] is longer than the total delay on signal Out[2] by an amount of delay caused from the additional two inverters 52. The multiplexer 62 selects one of its inputs to be output as delayed output signal 66. In this way, the delay on the output of the multiplexer 62 is selectable to a resolution of two inverter delays in this example. Other embodiments can use different amounts of inverters or other gates to provide different selectable delays to the input signal.

Delayed output signal 66 and the input signal 22 are input to a calibration block 68. The calibration block provides an output calibrated clock 26 that is based on a combination of the input signal 22 and the delayed output signal 66. In this example implementation, the combination of the signals is either a logical AND or a logical OR of the signals 22 and 66.

An AND gate 70 and an OR gate 72 are included in calibration block 68. Switches 74 are provided on the inputs to the AND gate 70 and switches 76 are provided on the inputs to the OR gate 72. Furthermore, a switch 78 is provided on the output of the AND gate and a switch 80 is provided on the output of the OR gate. These switches can be selectable by logic 18. This allows either the gate 70 and switches 74 and 78 to be selected for use, or the OR gate 72 and switches 76 and 80 to be selected for use, based in this example on whether the duty cycle of the input signal is above or below the target duty cycle. In the example of FIG. 3A, the duty cycle of the input clock signal 22 is greater than the 50% target duty cycle, and so the AND gate 70 is used instead of the OR gate 72. If the duty cycle of the input clock signal 22 is less than 50%, then the OR gate 72 is selected for use.

In the example shown in FIG. 3A, switches 74 and 78 are closed and switches 76 and 80 are open, allowing the AND gate 70 to be used and not the OR gate 72. This allows the input signal 22 to be input on one of the inputs to the AND gate 70 and the delayed output signal 66 to be input on the other of the inputs to the AND gate 70, causing a logical AND of these signals. The output of the AND gate 70 is provided as the calibrated output signal 26 of the coarse tuning circuit 12. If the duty cycle of the input signal 22 were less than the target duty cycle, then the OR gate 72 would be similarly selected to perform a logical OR of the input signal 22 and the delayed signal 66.

The calibrated coarse tuning output signal 26 can be output to various components in different embodiments. For example, coarse tuning output signal 26 can be output to the fine tuning circuit 14 as shown in FIG. 1, and/or or to components requiring the calibrated clock signal. The coarse tuning output signal 26 is also provided to the duty cycle detector 16. In embodiments having both coarse tuning circuit 12 and fine tuning circuit 14, the coarse tuning output signal 26 can be initially passed through or bypass the fine tuning circuit 14 during coarse tuning operations. The signal 26 may be directly provided to the duty cycle detector 16 in circuits in which there is no fine tuning circuit 14.

The duty cycle detector 16 outputs the duty cycle detection signal 30 to logic 18 based on the coarse tuning output signal 26. The logic 18 may select a different delay for the delayed signal 66 based on whether adjustment is still needed for the input signal to get closer to the target duty cycle. For example, if the duty cycle detection signal 30 indicates that the duty cycle is still too high compared to the target duty cycle, the logic 18 can instruct the multiplexer 62 to select the next inverter 52 output signal having the next greater delay. This is described below with reference to FIG. 4.

In other example embodiments, an OR gate can be used instead of AND gate 70 if the duty cycle of input signal 22 is over a predetermined target duty cycle and an AND gate can be used instead of OR gate 72 if the duty cycle of signal 22 is less than the predetermined target duty cycle.

Figure 3B:
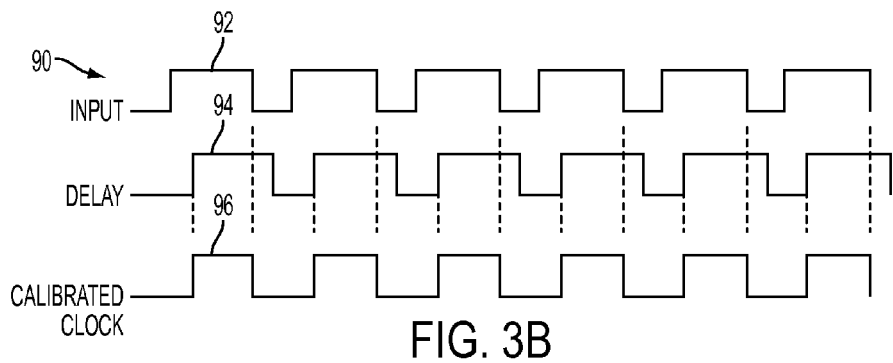
FIGS. 3B and 3D are signal diagrams illustrating signals used in operation of the coarse tuning circuit as shown in FIGS. 3A and 3C, respectively.

FIG. 3B is a signal diagram 90 illustrating signals used in operation of the coarse tuning circuit 12 as shown in FIG. 3A.

In this example, the input clock signal 22 can have the voltage vs. time waveform 92 in which the duty cycle is over 50%, e.g., the high pulse of the clock signal is on for greater than 50% of the time as compared to the low pulse of the clock signal. The delayed output signal 66 is shown as waveform 94, which is the waveform 92 that has been delayed by a selected amount of time using selected ones of the inverters 52.

The calibrated clock signal 26 is shown as waveform 96. This waveform is the result of ANDing the input clock 22 and the delayed output clock 66 by AND gate 70. Thus, the pulses of waveform 96 have a high amplitude level only when the waveform 92 and the waveform 94 are both at a high amplitude level, thus reducing the duty cycle in this example as is desired to adjust the duty cycle closer to 50%.

Figure 3C:
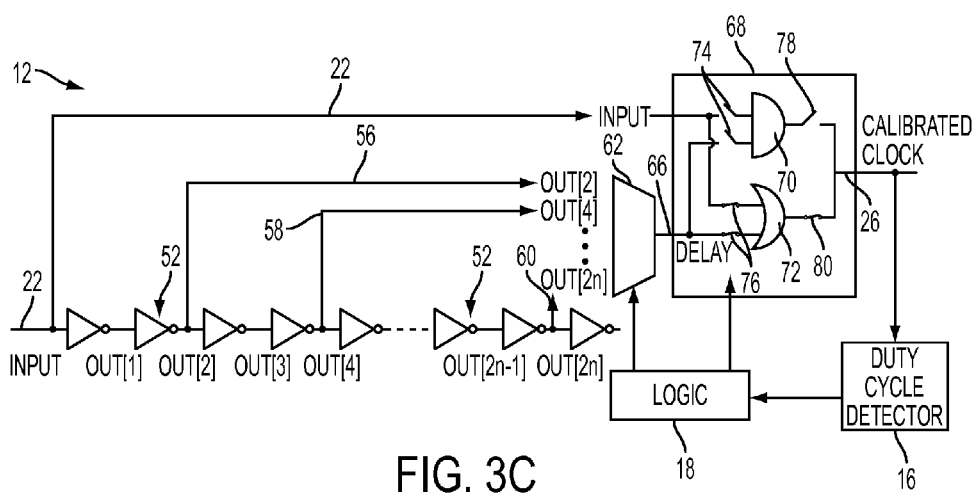

FIG. 3C is a schematic illustration of another example configuration of the coarse tuning circuit 12 of FIG. 3A. An input signal 22 is provided to the chain of gates 52 connected in series which provide a corresponding delay. However, in the example of FIG. 3C, the duty cycle of the input clock 22 is less than the target duty cycle of 50%. Thus, the OR gate 72 is used instead of the AND gate 70, by having logic 18 open the switches 74 and 78 associated with the AND gate 70, and close the switches 76 and 80 associated with the OR gate 72. This causes the input signal 22 to be ORed with the delayed output signal 66 to provide the calibrated output signal 26.

Figure 3D:
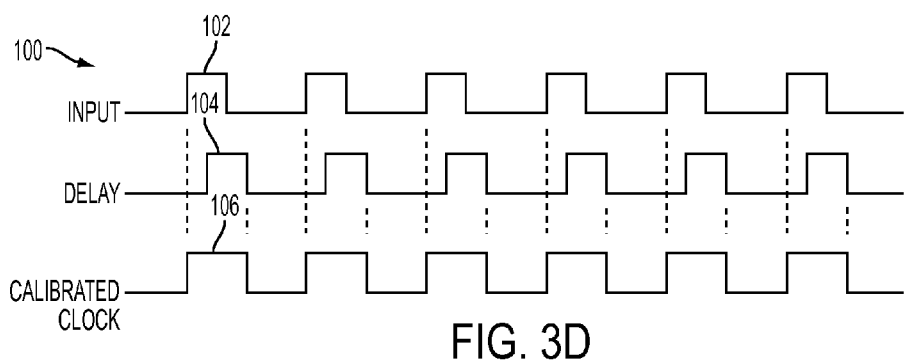

FIG. 3D is a signal diagram 100 illustrating signals used in operation of the coarse tuning circuit 12 as shown in FIG. 3C. In this example, the input clock signal 22 is shown by the waveform 102 in which the duty cycle is less than 50%, e.g., the high pulse of the clock signal is on for less than 50% of the time as compared to the low pulse of the clock signal. The delayed output signal 66 is shown as waveform 104, which is the waveform 102 after it has been delayed by a selected amount of time using selected ones of the inverters 52.

The calibrated clock signal 26 is shown as waveform 106. This waveform is the result of ORing the input clock 22 and the delayed output clock 66 by OR gate 72. Thus, the pulses of waveform 106 have a high amplitude level when either the level of waveform 102 or the level of waveform 104 is high, thus increasing the duty cycle in this example as is desired to adjust the duty cycle higher to become closer to 50%.

In other embodiments, the delay chain 52 and the multiplexer 62 as shown in FIGS. 3A and 3C can be considered only functional and their functions can be merged together in components of an actual circuit implementation. For example, gates (such as OR or NAND gates) can be used to implement the delay, and can be logically arranged to include multiplexer functionality to select the desired delay based on the control signal from logic 18. Such a merged implementation can in some embodiments provide reduced glitches caused by spikes or pulses in the signal during use of physical switches in a multiplexer 68.

Figure 4:
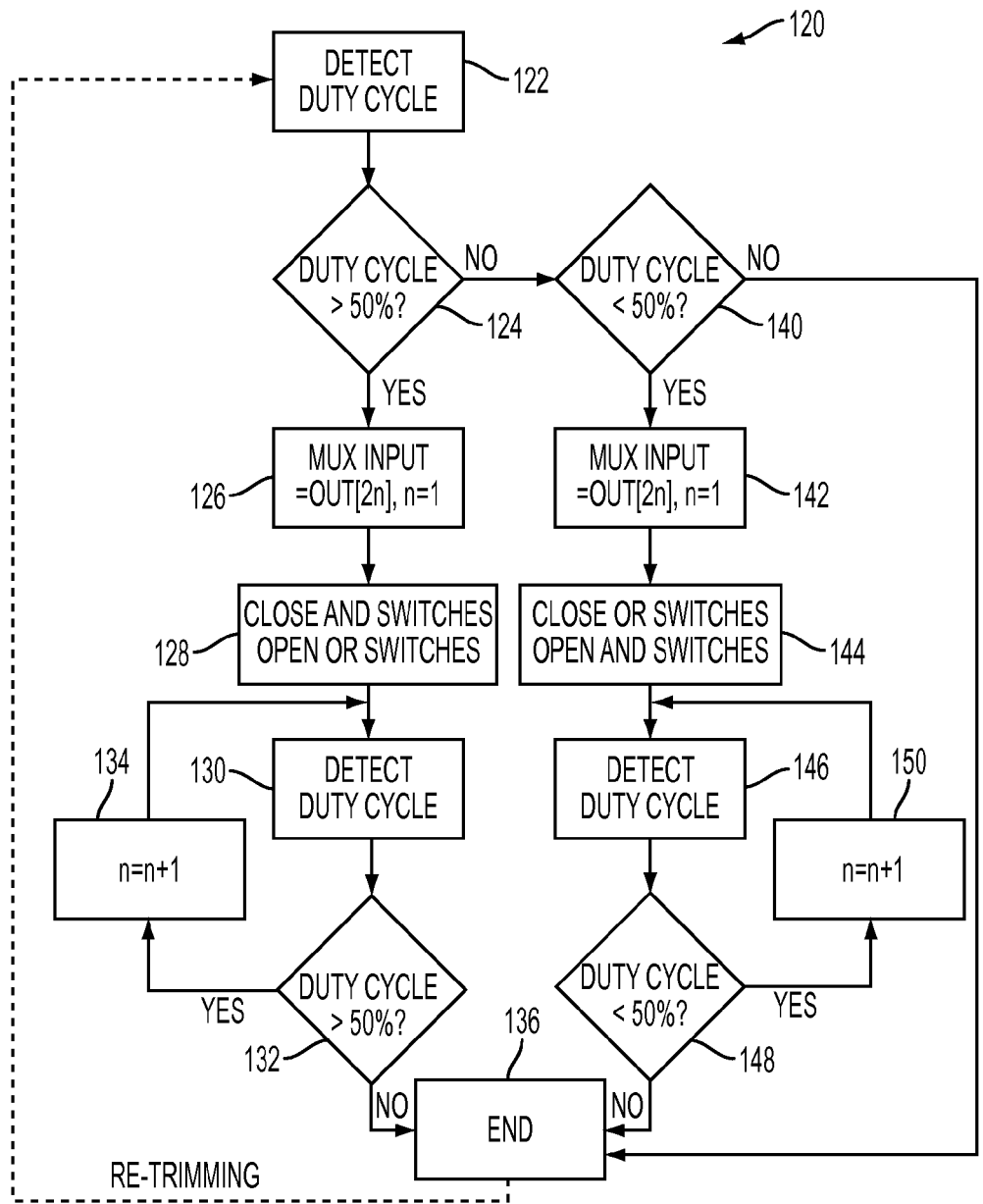
FIG. 4 is a flow diagram illustrating an example method for calibrating the duty cycle of a signal using the coarse tuning circuit of FIG. 3A or 3C.

FIG. 4 is a flow diagram illustrating an example method 120 for calibrating the duty cycle of a signal using a coarse tuning circuit as described herein. Method 120 can be implemented using a circuit as shown in FIG. 3A or 3C, as well as using logic 18 and/or a controller 20.

The method begins at step 122, in which the duty cycle of the input signal is detected by the duty cycle detector 16. For example, the input signal 22 can be passed through the coarse tuning circuit 12 (and fine tuning circuit 14 if present) for an initial detection of its duty cycle. The detection of duty cycle is described in greater detail below with respect to FIGS. 14-22.

In step 124, the process checks whether the duty cycle detected in step 122 is greater than the target duty cycle, which is 50% in this example. Other target duty cycle percentages can be checked in other embodiments, such as 20%, 70%, etc. If the duty cycle is greater than 50%, then in step 126 the input of the multiplexer 62 is initially set to the signal Out[2n], where n=1. This multiplexer input is the Out[2] signal 56 of FIG. 3A or 3C, which is the first inverter output line after two inverters in the series of inverters 52. In step 128, the AND switches 74 and 78 are closed and the OR switches 76 and 80 are opened.

In step 130, the duty cycle is again detected from the calibrated signal 26 by duty cycle detector 16. In step 132, the process checks whether the duty cycle is still greater than 50% (or other target duty cycle being used). If so, the process continues to step 134 to increase the value of n by 1 for selecting the multiplexer input Out[2n], which selects the next input of the multiplexer which has an increased delay from the previously-selected multiplexer input, thus decreasing the duty cycle further. The process then returns to step 130 to detect the duty cycle using this selected delay.

If the duty cycle is no longer greater than 50% as checked in step 132, then the duty cycle has been adjusted to cross the target threshold, and the coarse duty cycle calibration process ends at 136. In some embodiments, a re-trimming process can then be performed, in which the process returns to step 122 to detect the duty cycle again for additional tuning, e.g., if the input signal is prone to vary its duty cycle over time or temperature, or requires closer adjustment across the target threshold.

If the duty cycle is initially not found to be greater than 50% in step 124, then the process continues to step 140 in which the process checks whether the duty cycle is less than 50%. If not, then the duty cycle is at the desired target duty cycle and no calibration is needed, and the process ends at step 136. If the duty cycle is less than 50%, then in step 142 the input of the multiplexer 62 is initially set to the signal Out[2n], where n=1. This multiplexer input is the Out[2] signal line 56. In step 144, the OR switches 76 and 80 are closed and the AND switches 74 and 78 are opened.

In step 146, the duty cycle is again detected from the calibrated signal 26 by duty cycle detector 16. In step 148, the process checks whether the duty cycle is still less than 50% (or other target duty cycle being used). If so, the process continues to step 150 to increase the value of n by 1 for selecting the multiplexer input Out[2n], which selects the next input of the multiplexer which has an increased delay from the previously-selected multiplexer input, thus increasing the duty cycle further. The process then returns to step 146 to detect the duty cycle using this selected delay.

If the duty cycle is no longer greater than 50% as checked in step 148, then the duty cycle has been adjusted to cross the target threshold, and the coarse duty cycle calibration process ends at 136. In some embodiments, a re-trimming process can then be performed as described above.

Thus the process of FIG. 4 gradually increases the delay time between the input signal 22 and the delayed output signal 66 until the duty cycle changes from above to below the target duty cycle, or from below to above the target duty cycle, such that the calibrated output signal is as close to the target duty cycle as is desired and/or allowed by the circuit.

FIG. 5 is a schematic illustration of one example embodiment of a fine tuning circuit 14 of FIG. 1. The fine tuning circuit 14 can tune the duty cycle of an input signal to within an error range that is more precise than the error range of the tuning of the coarse tuning circuit 12.

An input signal 160 is to be calibrated by the circuit 14. For example, in some embodiments the input signal 160 can be the output signal 26 from the coarse tuning circuit 12. In other embodiments, the input signal 160 need not be provided from the coarse tuning circuit 12 or can be passed through the coarse tuning circuit 12 without adjustment. This can occur in embodiments in which only fine tuning of the duty cycle of the signal is needed. Fine tuning may be needed, for example, for radio frequency (RF) and millimeter-wave circuits.

The input signal 160 can be one input to a NAND gate 162, where the other input to the NAND gate 162 is an enable signal 163. The enable signal 163 can be provided by a controller 20, logic 18, or other source for enabling the use of the fine tuning circuit 12. The (inverted) output of the NAND gate 162 is provided to two transistors, such as to the gate of a PMOS transistor 164 and to a gate of an NMOS transistor 166. PMOS transistor 164 is connected to a Vdd voltage at its source and to a programmable resistor Rp at its drain. Similarly, NMOS transistor 166 is connected to ground at its source and to a programmable resistor Rn at its drain. The node 168 between the programmable resistors Rp and Rn is connected to one or more inverters, such as an inverter 170, which has an output connected to another inverter 172. The output of inverter 172 can be provided as calibrated output signal 28 of the fine tuning circuit 14. Calibrated output signal 28 is also input to the duty cycle detector 16 which detects the duty cycle of the signal 28, and provides an indication of the detected duty cycle to logic 18. Logic 18 provides control signal 178 to programmable resistor Rp and provides control signal 180 to programmable resistor Rn. The impedance or resistance of the programmable resistors can controlled with the control signals 178 and 180.

In general, a high level of the input clock signal 160 is inverted by the NAND gate 162, and this signal turns on the transistor 164 and turns off the transistor 166, causing the node 168 to charge up. A low level of the input clock signal 160 turns off the transistor 164 and turns on the transistor 166, causing the node 168 to discharge to ground (remove charge). To adjust duty cycle of the signal, the impedance of one of the resistors Rp or Rn can be increased while the impedance of the other resistor Rn or Rp can be decreased or minimized. This causes either the rise time or the fall time of the corresponding signal edges to be changed, i.e., the rising edge or the falling edge of the input signal 160 to rise or fall more slowly. This operation adjusts the duty cycle of the input signal to a fine degree. This operation is described in greater detail with respect to FIGS. 5B and 5C.

Figure 5A:
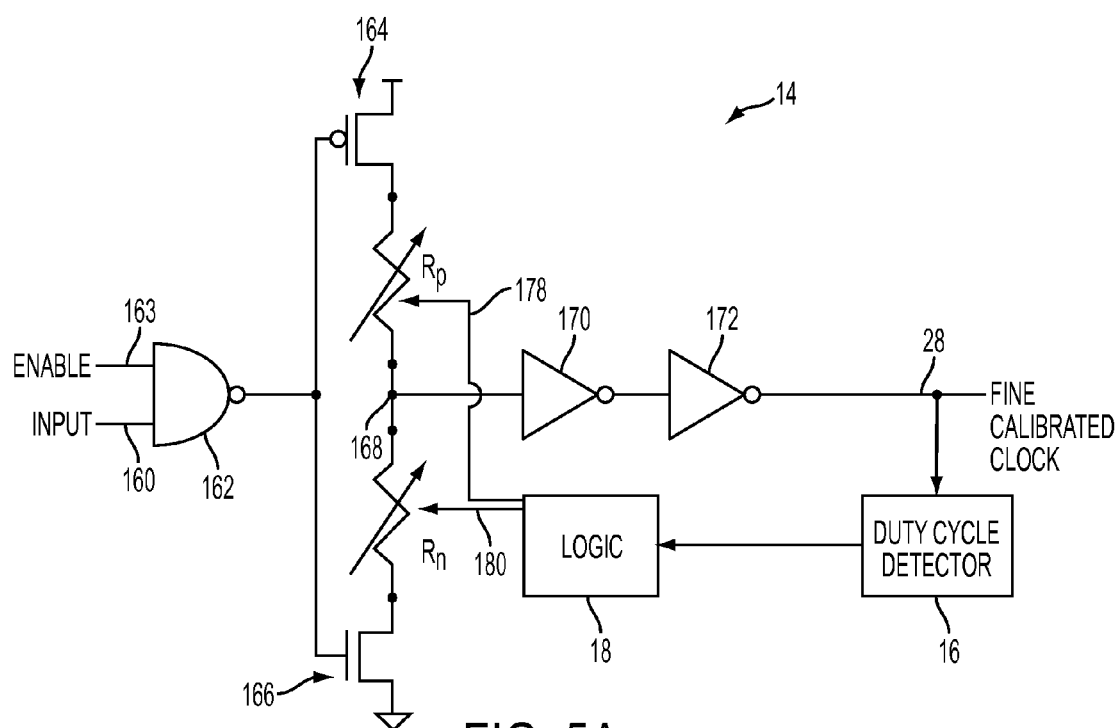
FIG. 5A is a schematic illustration of one example embodiment of a fine tuning circuit of FIG. 1.
Figure 5B:
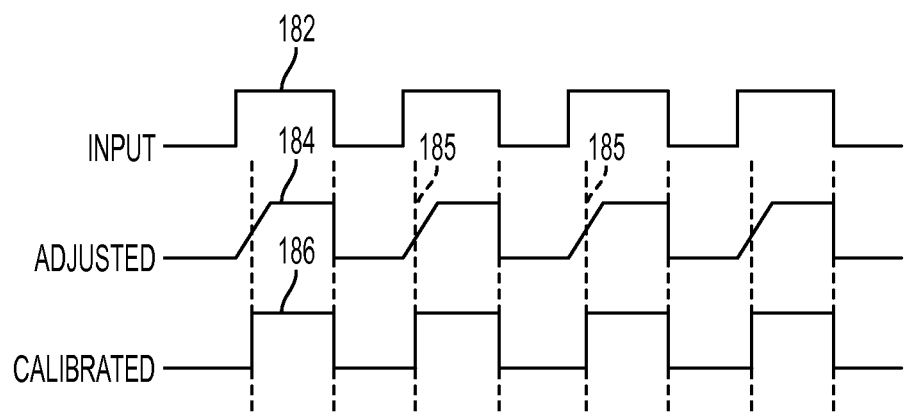
FIGS. 5B and 5C are diagrams illustrating signals used in the fine tuning circuit of FIG. 5 to lower and increase the duty cycle of the input signal, respectively.

FIG. 5B is a diagram illustrating signals used in operation of the fine tuning circuit 14 as shown in FIG. 5A to lower the duty cycle of the input signal. In this example, a 50% duty cycle is the desired target duty cycle. The input clock signal 160 is shown by the waveform 182 in which the duty cycle is greater than 50%, e.g., the high pulse of the clock signal is on for greater than 50% of the time as compared to the low pulse of the clock signal.

To lower the duty cycle, the resistance of resistor Rp is increased and/or the resistance of the resistor Rn is decreased. In some embodiments, the resistance of resistor Rn is decreased to a minimal or negligible amount. By increasing the impedance of the charging-up side of node 168, the rise time of the rising edge is increased based on the RC time constant of the circuit. The increased rising time causes the duty cycle to decrease. For example, an adjusted output signal at node 168 of FIG. 5A is shown as waveform 184. This waveform has increased the rise time on the rising edges of the signal due to increasing the resistance of Rp and/or decreasing the resistance of Rn. This causes the midpoint 185 of the rising edge to move closer to the falling edge. The inverters 170 and 172 then restore the sharp edges of the clock signal, where the restored sharp edges are provided at about the middle of the rise time of a rising edge. For example, the calibrated output signal 28 is shown by waveform 186, where the slowly-rising edges of waveform 184 have been sharpened at midpoint 185. The adjustment of the rising edge of the input waveform decreases the duty cycle of calibrated waveform 186 as compared to the duty cycle of input waveform 182. Thus the fine tuning circuit 14 allows the duty cycle to be adjusted to a fine degree by adjusting the resistance of the programmable resistors Rp and/or Rn.

Figure 5C:
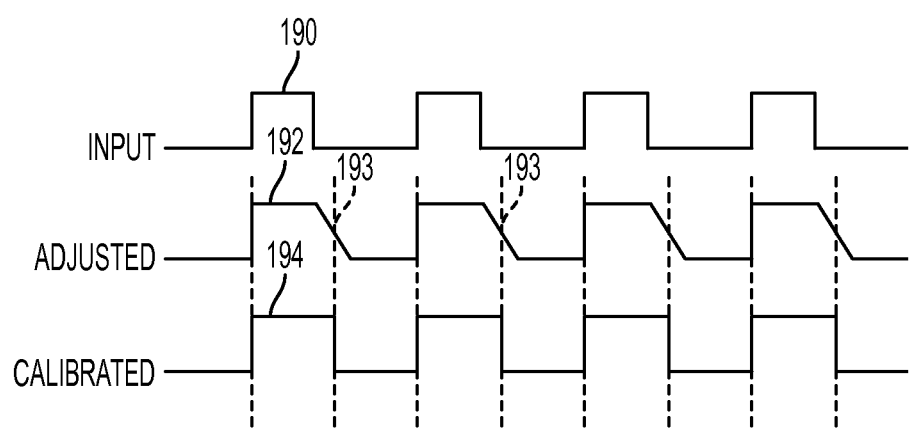

FIG. 5C is a diagram illustrating signals used in operation of the fine tuning circuit 14 as shown in FIG. 5A to increase the duty cycle of the input signal. In this example, a 50% duty cycle is the desired target duty cycle. The input clock signal 160 is shown by the waveform 190 in which the duty cycle is less than 50%, e.g., the high pulse of the clock signal is on for less than 50% of the time as compared to the low pulse of the clock signal.

To increase the duty cycle, the resistance of resistor Rn is increased and/or the resistance of the resistor Rp is decreased. In some embodiments, the resistance of resistor Rp is decreased to a minimal or negligible amount. By increasing the impedance of the discharging-down side of node 168, the fall time of the falling edge is increased based on the RC time constant of the circuit. The increased falling time causes the duty cycle to increase. For example, an adjusted output signal at node 168 of FIG. 5A is shown as waveform 192. This waveform has increased the fall time on the falling edges of the signal due to increasing the resistance of Rn and/or decreasing the resistance of Rp. This causes the midpoint 193 of the falling edge to move further from the previous rising edge. The inverters 170 and 172 then restore the sharp edges of the clock signal, where the restored sharp edges are provided at about the middle of the fall time of a falling edge. For example, the calibrated output signal 28 is shown by waveform 194, in which the slowly-falling edges of waveform 192 have been sharpened at midpoints 193. The adjustment of the falling edge of the input waveform increases the duty cycle of calibrated waveform 194 as compared to the duty cycle of input waveform 190.

In some embodiments, there may be limitations as to how much the fine tuning circuit can adjust a duty cycle of a signal. For example, if the slope of the rising edge or falling edge is not sufficiently sharp (e.g., too far from vertical), then jitter may increase and/or phase noise performance may be degraded. However, the coarse tuning circuit 12 described above can be used to calibrate for larger ranges if greater duty cycle adjustments are needed.

Figure 6:
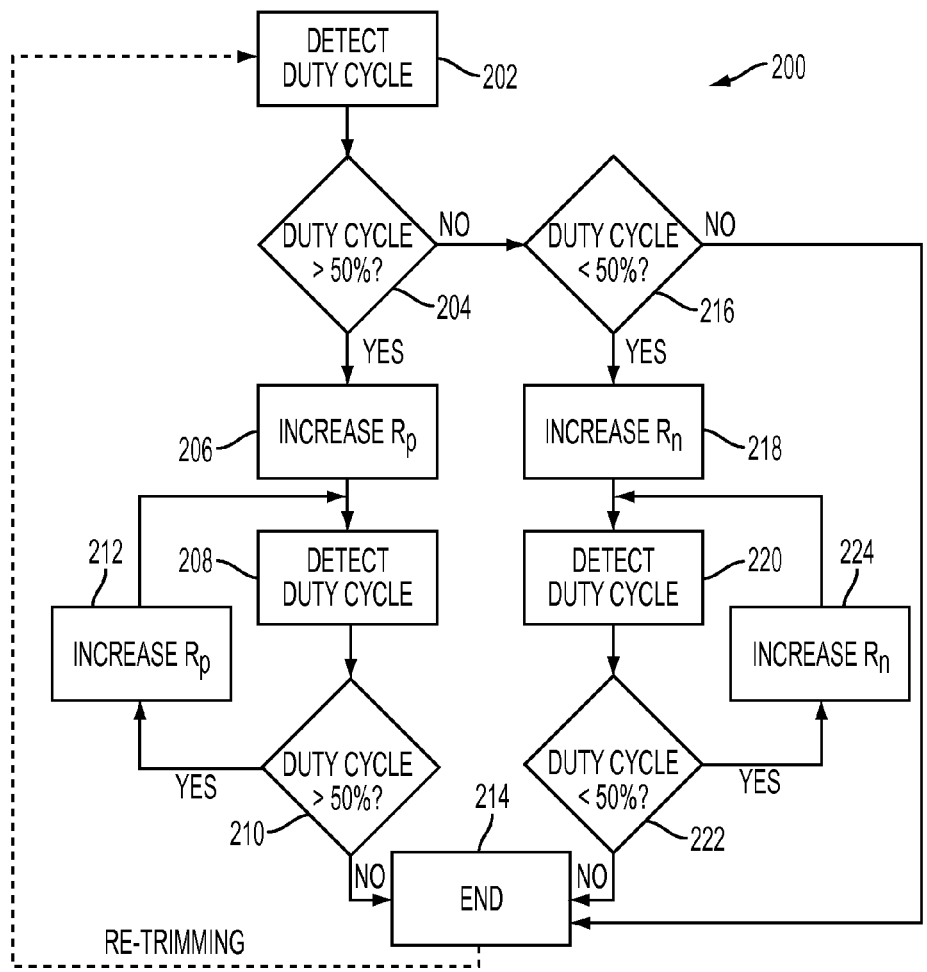
FIG. 6 is a flow diagram illustrating an example method for calibrating the duty cycle of a signal using a fine tuning circuit of FIG. 5A.

FIG. 6 is a flow diagram illustrating an example method 200 for calibrating the duty cycle of a signal using a fine tuning circuit as described herein. Method 200 can be implemented using a circuit as shown in FIG. 5A, as well as using logic 18 and/or a controller 20.

The method begins at step 202, in which the duty cycle of the received signal is detected by the duty cycle detector 16. For example, the received signal can be the coarse tuning calibrated signal 26, or can be input signal 22. This received signal can be passed through or bypass the fine tuning circuit 14 for an initial detection of its duty cycle. The detection of duty cycle is described in greater detail below with respect to FIGS. 14-21.

In step 204, the process checks whether the duty cycle detected in step 202 is greater than the target duty cycle, which is 50% in this example. Other target duty cycle percentages can be checked in other embodiments. If the duty cycle is greater than 50%, then in step 206 the resistance of resistor Rp is increased. For example, the logic 18 can send a control signal to the resistor Rp to increase its resistance. In some embodiments, the resistance of resistor Rn is decreased in step 206 instead of increasing the resistance of Rp, or in other embodiments both the resistance of Rp is increased and the resistance of Rn is decreased. For example, the amount of increase (and/or decrease) can be a predetermined amount that provides the desired tolerance of duty cycle calibration.

In step 208, the duty cycle is again detected from the calibrated signal 28 by duty cycle detector 16. In step 210, the process checks whether the duty cycle is still greater than 50% (or other target duty cycle). If so, the process continues to step 212 to increase the resistance of Rp (and/or decrease the resistance of Rn) similarly to step 206, thus decreasing the duty cycle further. The process then returns to step 208 to detect the duty cycle again with the adjusted duty cycle. If the duty cycle is no longer greater than 50% as checked in step 210, then the duty cycle has crossed the target threshold, and the fine duty cycle calibration process ends at 214. In some embodiments, a re-trimming process can then be performed, in which the process returns to step 202 to detect the duty cycle again for additional tuning, e.g., if the input signal is prone to vary its duty cycle over time or temperature, or requires closer adjustment across the target threshold.

If the duty cycle is not found to be greater than 50% in step 204, then the process continues to step 216 in which the process checks whether the duty cycle is less than 50%. If not, then the duty cycle is at the desired target duty cycle and no calibration is needed, and therefore the process ends at step 214. If the duty cycle is less than 50%, then in step 218 the resistance of resistor Rn is increased. For example, the logic 18 can send a control signal to the resistor Rn to increase its resistance. In some embodiments, the resistance of resistor Rp is decreased in step 218 instead of increasing the resistance of Rn, or in other embodiments both the resistance of Rn is increased and the resistance of Rp is decreased. For example, the amount of increase (and/or decrease) can be a predetermined amount that provides the desired tolerance of duty cycle calibration.

In step 220, the duty cycle is again detected from the calibrated signal 28 by duty cycle detector 16. In step 222, the process checks whether the duty cycle is still less than 50% (or other target duty cycle). If so, the process continues to step 224 to increase Rn (and/or decrease Rp), which increases the duty cycle as compared to the previously-selected resistance values of Rn and Rp. The process then returns to step 220 to detect the duty cycle using this selected delay. If the duty cycle is no longer less than 50% as checked in step 222, then the duty cycle has crossed the target threshold, and the fine duty cycle calibration process ends at 214. In some embodiments, a re-trimming process can then be performed as described above.

Thus the process of FIG. 6 gradually adjusts the resistance of one or more programmable resistors Rn and/or Rp to adjust the duty cycle of the calibrated output signal 28, until the duty cycle changes from above to below the target duty cycle, or from below to above the target duty cycle, such that the calibrated output signal is as close to the target duty cycle as desired and/or allowed by the circuit. In some embodiments, the fine tuning circuit 14 can allow duty cycle calibration with a timing error of less than a gate delay, in contrast with the timing error of within 2 gate delays for the example coarse tuning circuit 12 of FIG. 3A.

Figure 7:
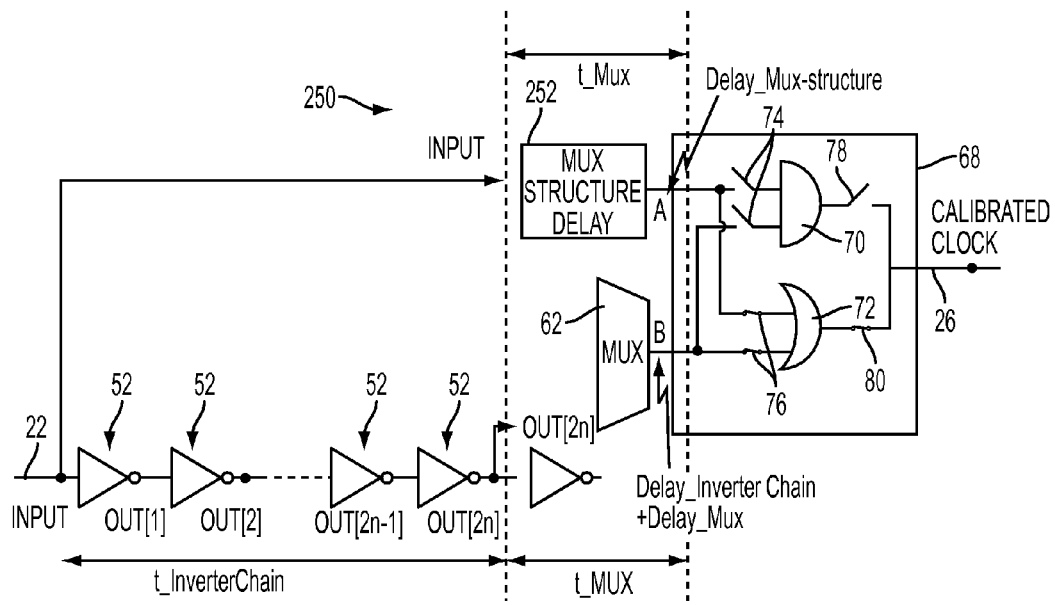
FIG. 7 is a schematic diagram illustrating an example of a coarse tuning circuit including error compensation for the multiplexer.

FIG. 7 is a schematic diagram illustrating an example embodiment 250 of a coarse tuning circuit 12 including error compensation for the multiplexer. Circuit 250 is similar to the coarse tuning circuit 12 described above, with similar components labelled similarly. Circuit 250 also includes a multiplexer structure delay block 252 which is positioned between the input 22 and the calibration block 68. Delay block 252 is inserted to cause a delay t_Mux which matches the delay error Delay_Mux caused by the multiplexer 62 to signals routed through the multiplexer. Delay block 252 thus cancels out any delay error caused by the multiplexer 68, allowing only the delay Delay_InverterChain caused by the inverters 52 to be in effect in the signal operations of block 68.

The switches 74, 76, 78, and 80 can be implemented using transmission gates or logic gates. In some embodiments, the time delay of the AND switches 74 and 78 can be matched or balanced with the time delay of the OR switches 76 and 78 so that any differences in duty cycle caused by the different sets of switches are reduced or minimized.

Figure 8:
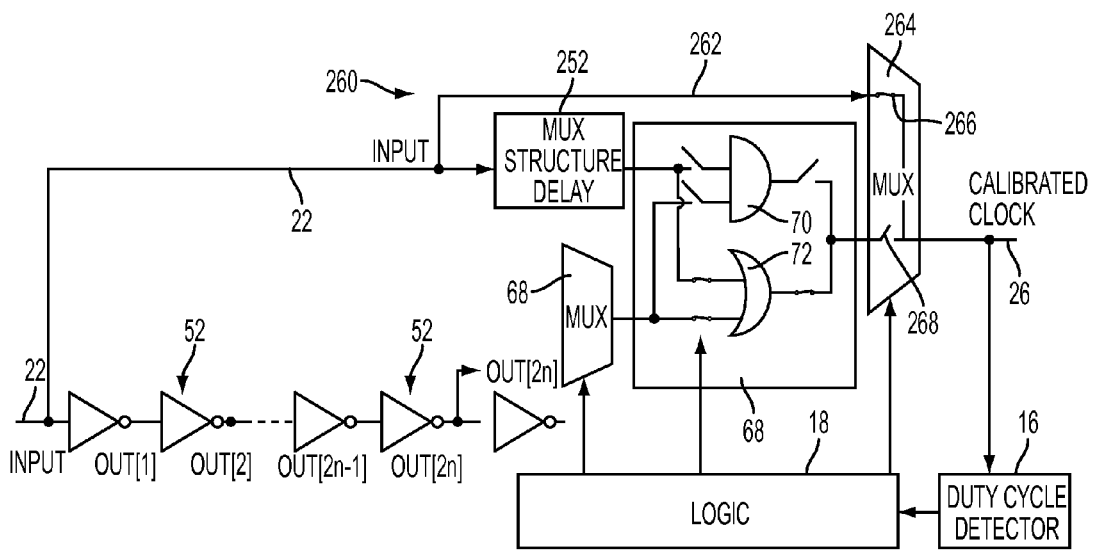
FIG. 8 is a schematic diagram illustrating another example of a coarse tuning circuit including an input signal bypass.

FIG. 8 is a schematic diagram illustrating another example embodiment 260 of a coarse tuning circuit 12 including an input signal bypass. This circuit can include bypass operation that can be used, for example, to allow a signal to pass through or bypass duty cycle adjustment if the signal already has the desired target duty cycle. Circuit 260 is similar to the coarse tuning circuits 12 and 250 described above, with similar components labelled similarly. Circuit 260 also includes an input signal bypass path or line 262, which is connected to the input signal 22. A multiplexer 264 is connected to the bypass line 262, where the multiplexer includes a switch 266 which allows the signal on the bypass line 262 to pass as the calibrated output 26, or not. Multiplexer 264 is also connected to the output of the calibration block 68, where a switch 268 of the multiplexer allows the signal output of the calibration block to pass or not as the calibrated output 26. Logic 18 provides a control signal to the multiplexer 264 which controls one of the switches 266 and 268 to be open while the other of the switches is closed. Switch 268 is controlled to be closed if the duty cycle of the input signal 22 needs to be calibrated (e.g., as determined by the duty cycle detector 16). Switch 266 is closed to allow the input signal 22 pass directly out as the calibrated output signal 26 if the duty cycle of the input signal 22 does not require calibration as determined by the duty cycle detector 16.

Figure 9A:
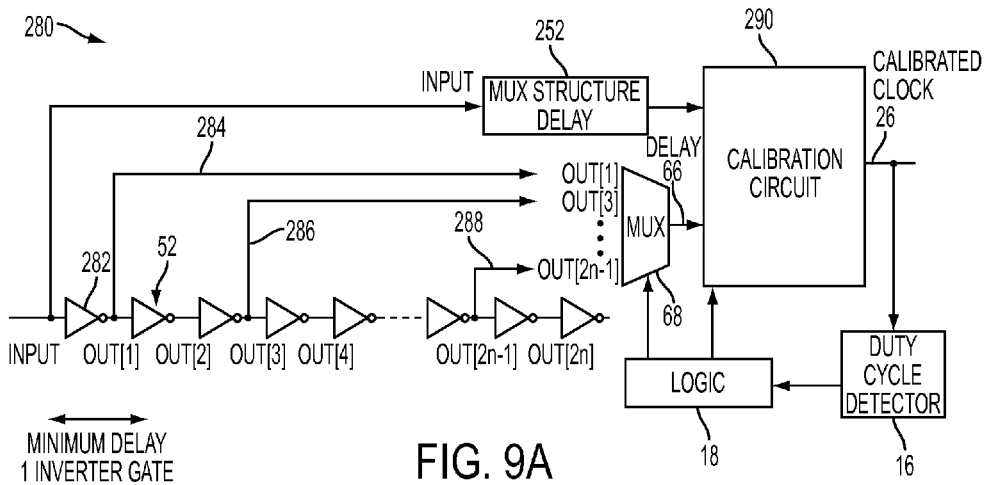
FIG. 9A is a schematic diagram illustrating another example of a coarse tuning circuit using edges of signals.

FIG. 9A is a schematic diagram illustrating another example embodiment 280 of a coarse tuning circuit 12 including a different calibration circuit. Similar components to those of the previous coarse tuning circuits are labeled similarly. In circuit 280, rising or falling edges of the input signal 22 and delayed output signal 66 are detected to generate the calibrated output signal 26, instead of basing the calibrated output signal on the high and low levels of the input signal and delayed signal as described above. In some embodiments, this coarse tuning circuit 280 can allow a duty cycle of the input signal 22 to be smaller than 25%.

Coarse tuning circuit 280 includes serial inverters 52 to delay the input signal 22 similarly as described above. However, in this embodiment, a first inverter output 284 to the multiplexer 68 is connected after a single inverter 282 instead of two inverters as in the embodiment of FIG. 3A. This allows a one-gate delay to be selected by the multiplexer 68 and thus provides finer degree of calibration than the coarse tuning circuit 12 of FIGS. 3A and 3C. The remaining output signals 284, 286, and up to signal 288 are each connected after two inverters 52 from the previous output signal. Thus, including the single inverter 282, these output signals provide a delay based on an odd number of inverters, which inverts the input signal 22.

A calibration circuit 290 receives the input signal 22 (which can be delayed by the multiplexer structure delay 252) and receives the delayed output signal 66 from the multiplexer 68. The calibration circuit 290 outputs the calibrated clock signal 26 based on the rising or falling edges of the received signals 22 and 66. In this embodiment, the calibration circuit 290 provides edges to the calibrated output signal 26 based on the falling edges of the signals 22 and 66 if the input signal duty cycle is greater than the target duty cycle, e.g., greater than 50% duty cycle in this example. The calibration circuit 290 provides edges to the calibrated output signal 26 based on the rising edges of the signals 22 and 66 if the input signal duty cycle is less than the target duty cycle. This is described with reference to FIGS. 9B and 9C. The calibration circuit 290 can be implemented using any suitable edge-triggered circuit to provide the functionality described herein.

Figure 9B:
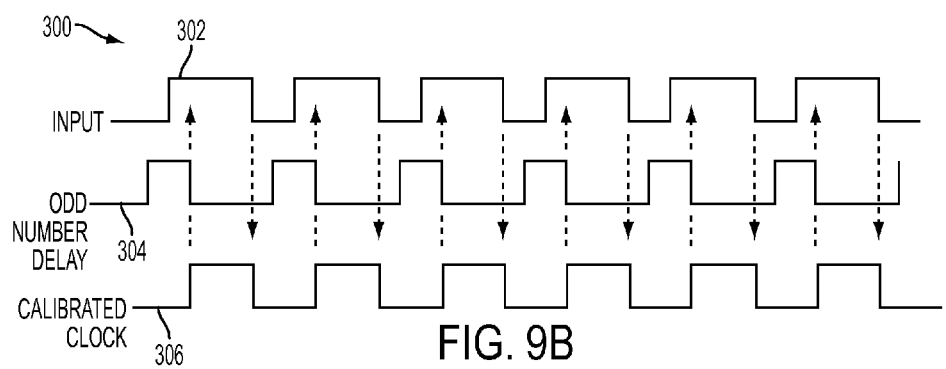
FIGS. 9B and 9C are signal diagrams illustrating signals used in operation of the coarse tuning circuit of FIG. 9A.

FIG. 9B is a signal diagram 300 illustrating signals used in operation of the coarse tuning circuit 280 as shown in FIG. 9A in which the duty cycle of the input signal 22 is over the target duty cycle (50% in this example). The input clock signal 22 is shown as the voltage vs. time waveform 302. The delayed output signal 66 is shown as waveform 304, which has been inverted and delayed by an odd number of inverters 52.

The calibrated clock signal 26 is shown as waveform 306. The edges of waveform 306 are formed by the falling edges of the input waveform 302 and the delay output waveform 304. Thus, the calibrated waveform 306 is pulled to a high level when there is a falling edge to the delayed output waveform 304. Similarly, the calibrated waveform 306 is pulled low at the next falling edge of the input waveform 302. Since the delayed waveform 304 is delayed and inverted compared to the input waveform 302, this falling-edge control over the calibrated signal 26 reduces the duty cycle as compared to the input signal 22, as is desired to adjust the duty cycle closer to 50%.

Figure 9C:
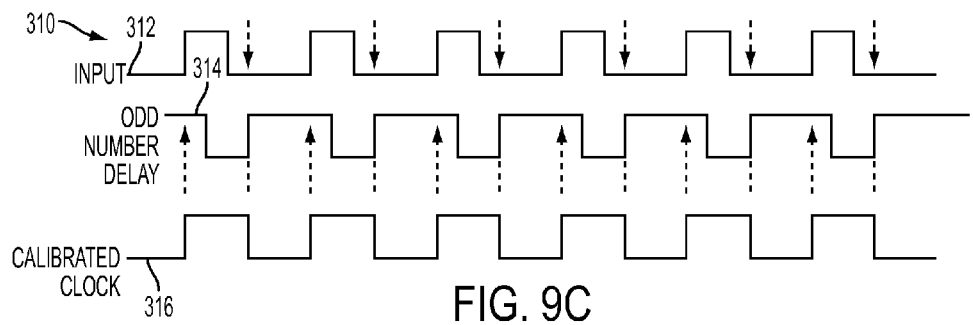

FIG. 9C is a signal diagram 310 illustrating signals used in operation of the coarse tuning circuit 280 as shown in FIG. 9A, in which the input signal 22 has a duty cycle under the target duty cycle (in this example, 50%). The delayed output signal 66 is shown as waveform 314, which has been inverted and delayed by an odd number of inverters 52.

The calibrated clock signal 26 is shown as waveform 316. This waveform is formed by the rising edges of the input waveform 312 and the delay output waveform 314. Thus, the calibrated waveform 316 is pulled high when there is a rising edge to the input waveform 312. Similarly, the calibrated waveform 316 is pulled low when there is a rising edge to the delayed output waveform 314. Since the delayed waveform 314 is delayed and inverted compared to the input waveform 302, this rising-edge control over the calibrated signal 26 increases the duty cycle as compared to the input signal 22, as is desired to adjust the duty cycle closer to 50%.

In various embodiments, the calibration circuit 290 can cause the output signal 26 to have edges based on the delayed signal 66 and based on one of the falling or rising edges of the input signal 22 in response to the duty cycle of the input signal being over a predetermined target duty cycle. Furthermore, the calibration circuit 290 can cause the output signal to have edges based on the delayed signal 66 and the other of the falling and rising edges of the input signal 22 in response to the duty cycle of the input signal being less than a target duty cycle.

Figure 10A:
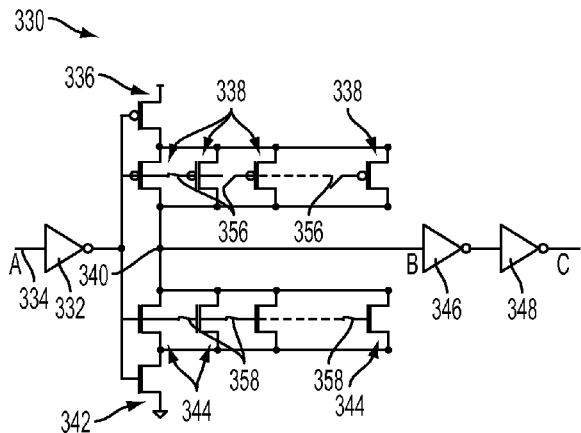
FIGS. 10A, 10C, 10E, and 10F are schematic diagrams of alternate embodiments of the fine tuning circuit shown in FIG. 1.

FIG. 10A is a schematic diagram of an alternate embodiment 330 of the fine tuning circuit 14 shown in FIG. 1. In this embodiment, cascade MOS devices are used instead of programmable resistors Rn and Rp as shown in the embodiment of FIG. 5A.

Fine tuning circuit 330 includes an inverter 332 that receives the input signal 334, which can be the output of the coarse tuning circuit 12 or an input signal from another source. The output of inverter 332 is connected to the gates of PMOS transistor 336 as well as cascade PMOS transistors 338, where the transistor 336 is connected at its source to a supply voltage and the transistors 338 are connected between the drain of transistor 336 and a node 340. The output of inverter 332 is also connected to the gates of NMOS transistor 342 as well as cascade NMOS transistors 344, where the transistor 342 is connected to ground (at its source and transistors 344 are connected between the drain of transistor 342 and node 340. Node 340 is connected to inverter 346 which has an output connected to inverter 348, which provides the calibrated output signal 28 which is used similarly to the circuit 14 described above with reference to FIG. 5A. Other types of transistors can be used in other embodiments.

Figure 10B:
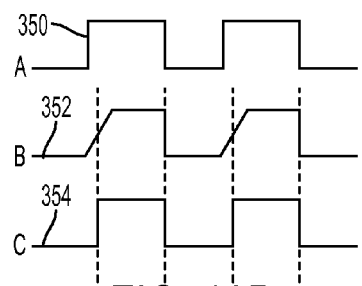
FIGS. 10B and 10D are diagrams illustrating signals used in operation of the fine tuning circuit as shown in FIGS. 10A and 10C, respectively.
Figure 10C:
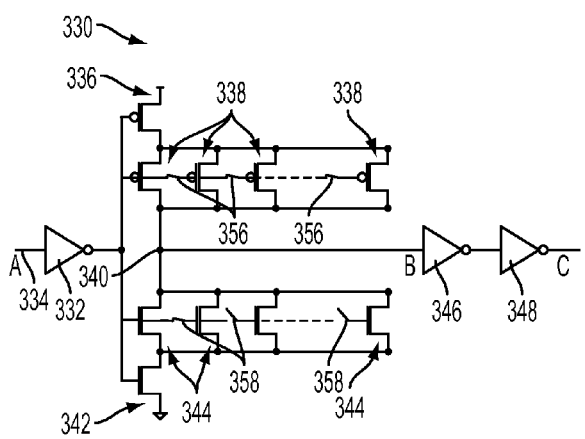

FIG. 10B is a diagram illustrating signals used in operation of the fine tuning circuit 330 as shown in FIG. 10A to lower the duty cycle of the input signal. The input signal 334 is shown by the waveform 350 (at node A in FIG. 10A) in which the duty cycle is greater than the target duty cycle (e.g., 50%). To lower the duty cycle, the resistance on the source voltage side of the node 340 is increased and/or the resistance of the ground side of node 340 is decreased. In this embodiment, the voltage-side resistance is increased by opening one or more of the switches 356 that connect each gate of each series cascade transistor 338 to the output of inverter 332. The ground-side resistance is decreased by closing all of the switches 358 that connect each gate of each cascade transistor 344 to the output of inverter 332. This causes more current paths on the ground side than the voltage side, thus increasing the relative resistance on the voltage side. As a result, the rising edge of the signal at node 340 (at node B in FIG. 10A) to have a greater rise time as shown in waveform 352 of FIG. 10B, thus decreasing the duty cycle of the resulting calibration signal shown by waveform 354 (at node C in FIG. 10A), similarly as explained above for FIG. 6.

Figure 10D:
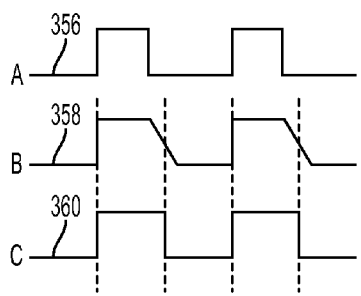

FIG. 10O is a schematic diagram of embodiment 330 of the fine tuning circuit 14 in which resistance is provided on the ground side of node 340. As shown in FIG. 10D, the input signal 334 is shown by the waveform 356 in which the duty cycle is less than the target duty cycle (e.g., 50%). One or more of the switches 358 are opened to cause the associated NMOS transistors 358 to be disconnected from the output of inverter 332. This causes a greater resistance on the ground side than the voltage side of node 340, since all the switches 356 on the voltage side are closed, thus connecting all the transistors 338 to the output of inverter 332. As a result, the falling edge of the signal at node 340 has a greater fall time as shown in waveform 358 of FIG. 10B, thus increasing the duty cycle of the resulting calibration signal shown by waveform 360, similarly as explained above for FIG. 7.

Figure 10E:
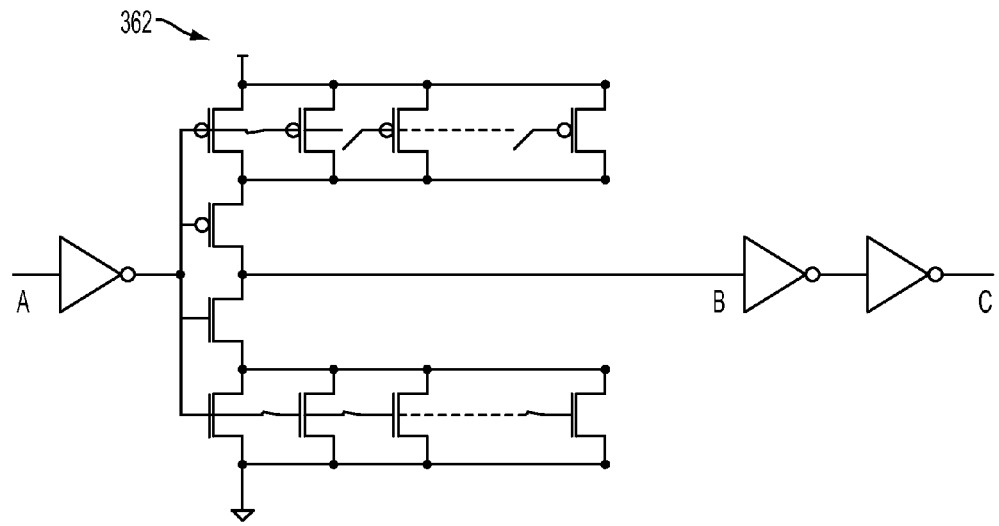
Figure 10F:
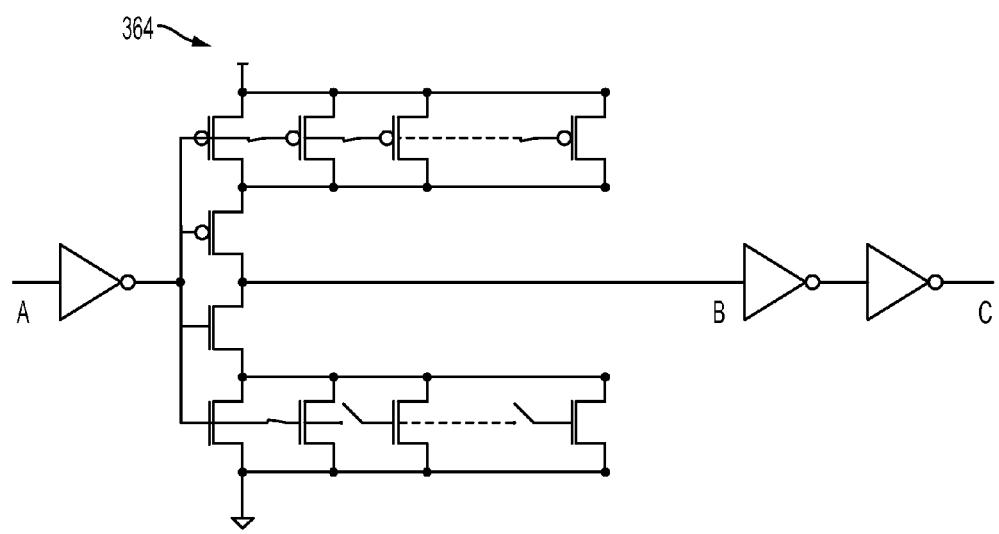

FIG. 10E and FIG. 10F are schematic diagrams illustrating embodiments 362 and 364 similar to FIG. 10A and FIG. 10O, respectively, where the programmable devices are swapped with cascode counterparts.

Figure 11:
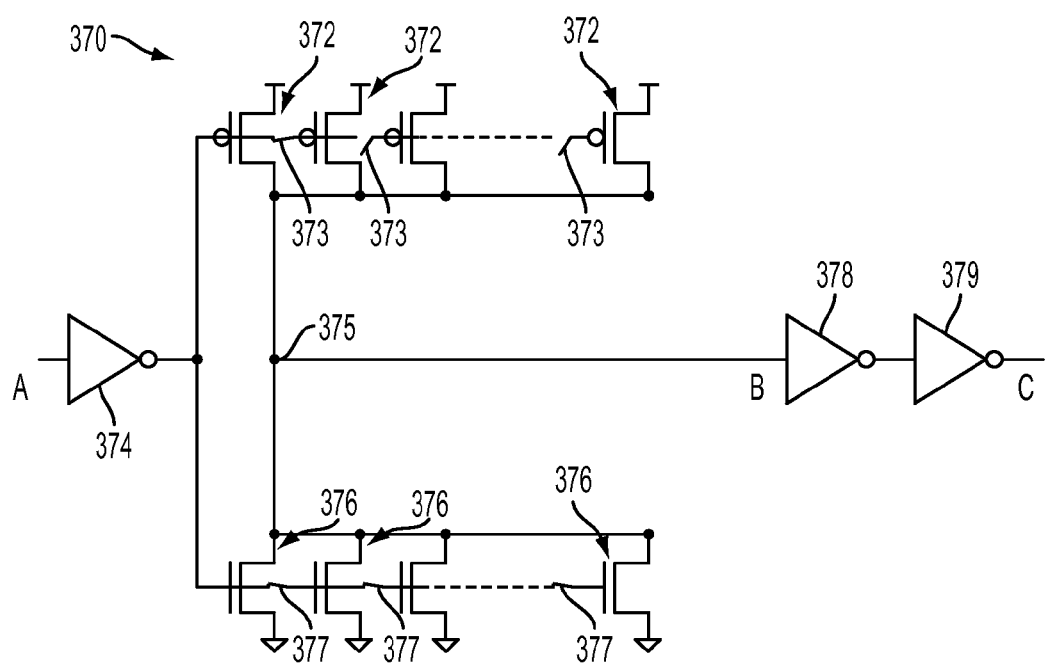
FIGS. 11-13 are schematic diagrams of alternate embodiments of the fine tuning circuit shown in FIG. 1.

FIG. 11 is a schematic diagram of an alternate embodiment 370 of the fine tuning circuit 14 shown in FIG. 1. This embodiment is similar to the embodiment 330 of FIGS. 10A and 10C, in which cascade MOS devices are used instead of programmable resistors Rn and Rp. In embodiment 370, the gates of cascade PMOS transistors 372 are coupled to the output of inverter 374 that inverts the input signal. Unlike the embodiment 330, the transistors 372 are each coupled between the voltage source and node 375 and there is no other transistor coupled between the cascade PMOS transistors 372 and the voltage source. Similarly, the gates of NMOS transistors 376 are coupled to the output of inverter 374. The NMOS transistors are coupled between the node 375 and ground. Inverters 378 and 379 function similarly to the equivalent inverters of embodiment 330.

Switches 373 and 377 are coupled at the gates of the transistors 372 and 376, respectively. A subset of the switches 373 can be opened and all of the switches 377 can be closed if the duty cycle is greater than the target duty cycle, as shown in FIG. 11. This causes a greater rise time for the rising edges of the output at node 375 and reduces the duty cycle of the calibrated output of inverter 379, similarly to embodiment 330 as shown in FIG. 10B. If the duty cycle is less than the target duty cycle, a subset of the switches 377 can be opened and all of the switches 373 can be closed (not shown). This causes a greater fall time for the falling edges of the output at node 375 and reduces the duty cycle of the calibrated output of inverter 379, similarly to embodiment 330 as shown in FIG. 10D.

Figure 12:
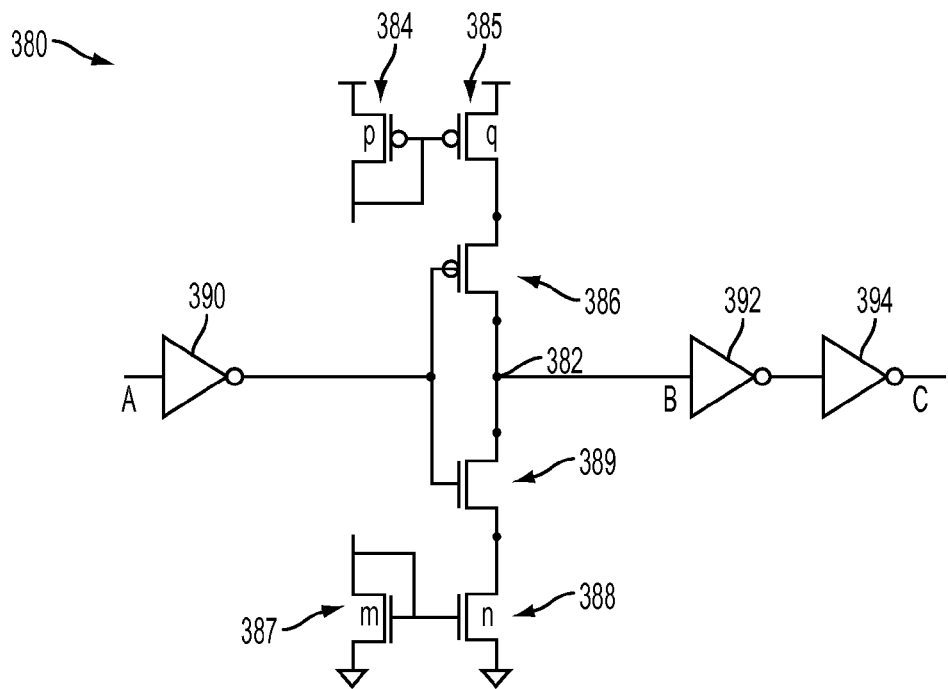

FIG. 12 is a schematic diagram of an alternate embodiment 380 of the fine tuning circuit 14 shown in FIG. 1. In this embodiment, analog adjustments are provided to fine tune the duty cycle of the input signal. A current mirror is provided on each side of the output node 382. In one current mirror, PMOS transistors 384 and 385 have their gates connected and their sources connected to the voltage supply, where the transistor 384 has its gate tied to its drain. The drain of transistor 385 is coupled to the source of PMOS transistor 386, which has its drain coupled to node 382. Similarly, the other current mirror includes NMOS transistors 387 and 388 have their gates connected and their sources connected to ground, where the transistor 387 has its gate tied to its drain. The drain of transistor 388 is coupled to the source of NMOS transistor 389, which has its drain coupled to node 382. Inverters 390, 392, and 394 are connected similarly to equivalent inverters in embodiment 330.

In embodiment 380, the magnitude of current provided by one of the current mirrors is adjusted to finely tune the duty cycle of the input signal. For example, the ratio of current through transistor 384 can be made 10 times the current through transistor 385. A reference current through transistor 384 can be adjusted using a current source to modify the current through transistor 385 and change the rise time of the signal at node 382. For example, a lesser current through transistor 385 can cause longer rise times of the rising edge of the output signal at node 382, thus decreasing the duty cycle similarly to the embodiment of FIGS. 10A-10B. Similarly, a reference current through transistor 387 can be decreased to cause longer fall times of the falling edge of the output at node 382, thus increasing the duty cycle similarly to the embodiment of FIGS. 10C-10D.

In other embodiments, a number of connected transistors (such as MOSFETs) can be provided at each of the symbols shown for transistors 384, 385, 387, and 388. A ratio of the number of transistors turned on at transistor symbol 384 to the number of transistors turned on at symbol 385 can be used, for example. This ratio can be adjusted to change the duty cycle of the signal at node 382. For example, a smaller ratio of transistors for symbols 384 and 385 causes a lesser amount of current to flow through transistors at symbol 385, thus increasing the signal rise time and decreasing the duty cycle. A similar ratio of transistors between symbol 387 and 388 can be adjusted to adjust the duty cycle. For example, a smaller number of transistors turned on at symbol 387 causes a smaller ratio and a lesser current to flow through transistors at symbol 388, thus increasing the signal fall time and increasing the duty cycle.

Figure 13:
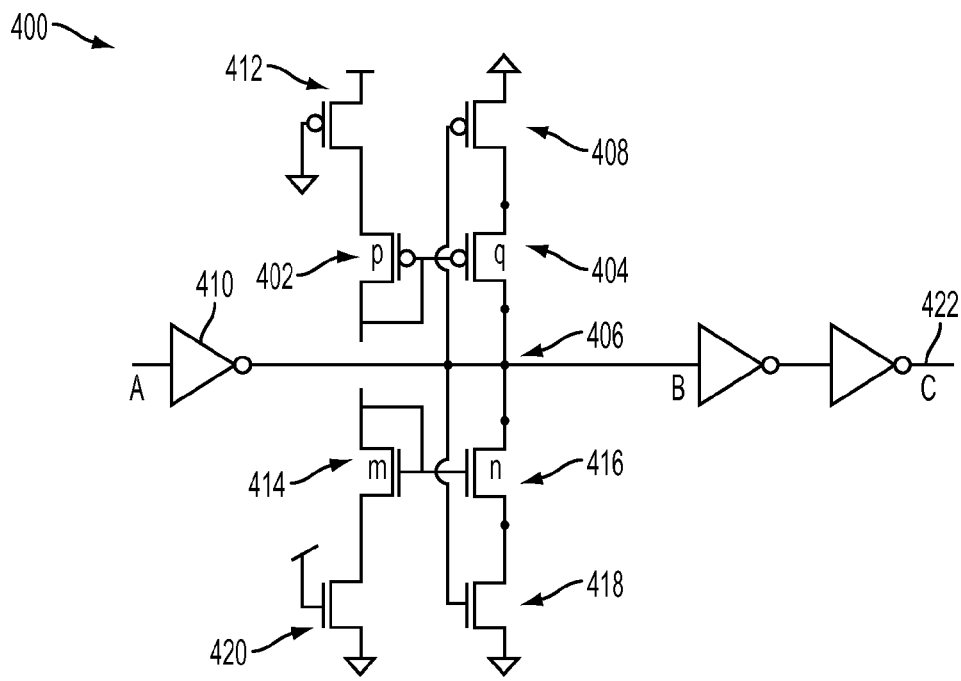

FIG. 13 is a schematic diagram of an alternate embodiment 400 of the fine tuning circuit 14 shown in FIG. 1. In this embodiment, similar to the embodiment of FIG. 12, analog adjustments are provided to fine tune the duty cycle of the input signal. Embodiment 400 uses current mirrors similarly to the embodiment 380 of FIG. 12. Transistors 402 and 404 can form a voltage source-side current mirror, where transistor 404 is connected between the node 406 and a PMOS transistor 408 that has its gate connected to the output of inverter 410. Another PMOS transistor 412 can be connected between the voltage source and the transistor 402. Similarly, transistors 414 and 416 can form a ground-side current mirror, where transistor 416 is connected between the node 406 and a NMOS transistor 418 that has its gate connected to the output of inverter 410. Another NMOS transistor 420 can be connected between the transistor 414 and ground.

Similarly to the embodiment 380 of FIG. 12, the reference current through the transistor 402 or through the transistor 420 can be modified to change the current through transistors 404 or 416, respectively, thus changing the rise or fall times of the signal edges and adjusting the duty cycle accordingly. Alternatively, the ratio of the number of transistors at the symbols 402 and 404, or symbols 414 and 416, can be changed to adjust the duty cycle of the signal at the node 406 and at the calibrated output 422, similarly as explained above for FIG. 12.

Figure 14:
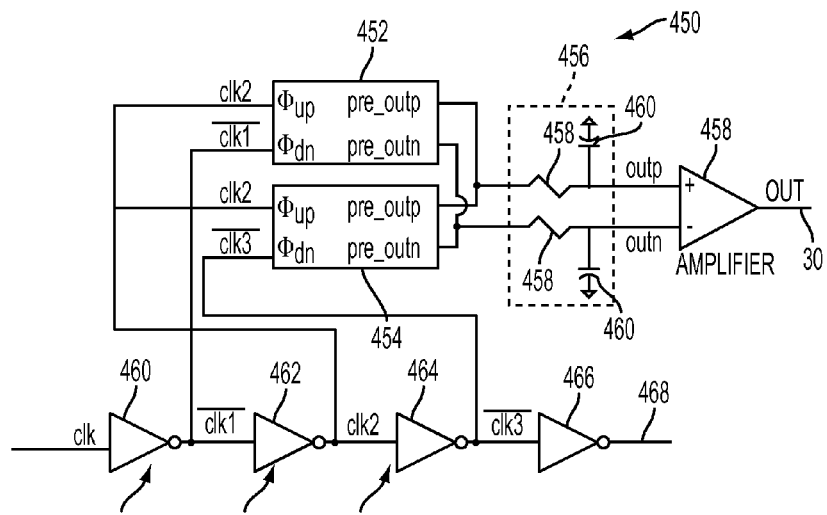
FIG. 14 is a schematic diagram of one embodiment of a duty cycle detector of FIG. 1.

FIG. 14 is a schematic diagram of one embodiment 450 of a duty cycle detector. For example, duty cycle detector 450 can be used as detector 16 in the calibration system shown in FIG. 1. In such embodiments, the duty cycle detector 450 receives the calibrated output signals 26 and/or 28 and detects a duty cycle of those signals. For example, the detector 450 provides a duty cycle detection signal 30 that is indicative of the current duty cycle of the signals relative to a target duty cycle for which the detector has been designed or programmed to detect. The duty cycle detection signal is provided to the logic 18 to allow adjustment of the tuning circuits 12 and/or 14 based on the current duty cycle. The duty cycle detector 450 includes inverters 451, a first detector core 452, a second detector core 454, a filter 456, and a comparator 458.

The inverters 451 are used to provide multiple clock signals to the detector cores 452 and 454. The input signal 22 is labelled as CLK in FIG. 14 and is input to an inverter 460, which provides an output that is signal CLK1. This signal in turn is input to an inverter 462 which provides an output that is signal CLK2. The CLK2 signal is input to an inverter 464 which provides an output that is signal CLK3. The CLK3 signal is input to an inverter 466 which provides an output 468 that is the same polarity as the CLK signal. The inverters 462 and 464 provide a delay to the CLK2 and CLK3 signals which allows a reduction in the mismatch between charging and discharging of the two detector cores 452 and 454, as described in greater detail below.

The first detector core 452 receives clock signals from the inverters 451. In this embodiment, first core 452 receives the CLK1 signal at a $\phi_{dn}$ input and receives the CKL2 input at a $\phi_{up}$ input. The second detector core 454 receives the CLK3 signal at a $\phi_{dn}$ input and receives the CLK2 input at a $\phi_{up}$ input. Each core 452 and 454 outputs a pre_outp signal, which are connected together and input to the filter 456. Each core 452 and 454 also outputs a pre_outn signal, which are connected together and input to the filter 456. The pre_outp signal is positive and the pre_outn signal is negative if the duty cycle of the input signal is greater than the target duty cycle (such as a target duty cycle of 50% in some embodiments). The pre_outp signal is negative and the pre_outn signal is positive if the duty cycle of the input signal is less than the target duty cycle. In some embodiments, the first and second detector cores 452 and 454 are implemented the same way. Some examples of a detector core is described below with respect to FIGS. 15A and 15B.

Filter 456 receives the pre_outp and pre_outn signals from the detector cores 452 and 454 and filters out ripple caused by charging and discharging in the cores. In some embodiments, the filter 456 can include a resistor 458 connected in series and a capacitor 460 connected in parallel on each of the pre_outp and pre_outn signals to provide an RC low pass filter for each signal. The filter outputs outp and outn signals which are filtered signals of the pre_outp and pre_outn signals, respectively.

A comparator 458 is connected to the outputs of the filter 456, where the positive input to the comparator is connected to the outp signal and the negative input to the comparator is connected to the outn signal. The comparator can amplify the signals and output a signal based on the comparison between the two signals. The output signal can be duty cycle detection signal 30 which is sent to the logic 18 as described for FIG. 1. For example, the comparator output signal 30 can be high if the outp signal has a higher voltage level than the outn signal, indicating a duty cycle greater than the target duty cycle. The output 30 can be low if the outp signal has a lower voltage level than the outn signal.

Figure 15A:
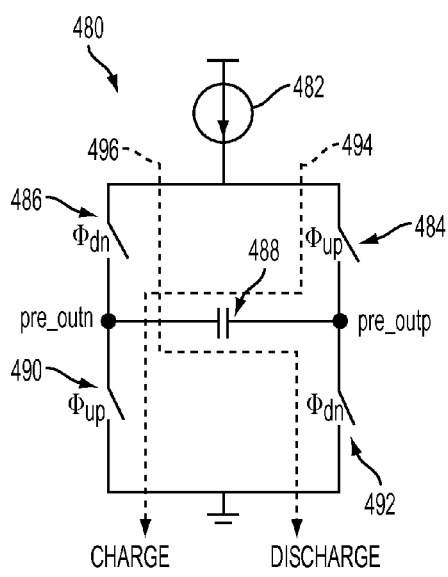
FIG. 15A and FIG. 15B are schematic diagrams of embodiments of a detector core used in the duty cycle detector of FIG. 14.

FIG. 15A is a schematic diagram of one embodiment 480 of a detector core, which can be used as first detector core 452 and/or second detector core 454 of FIG. 14. Detector core 480 includes a current source 482, which can be connected to a supply voltage. A first up switch ($\phi_{up}$) 484 and a first down switch 486 ($\phi_{dn}$) are connected to the current source 482. A capacitor 488 is coupled between the up switch 484 and the down switch 486, where the pre_outp output is provided on one terminal of the capacitor and the pre_outn output is located on the other terminal of the capacitor. A second up switch ($\phi_{up}$) 490 is connected to the pre_outp output and a second down switch ($\phi_{dn}$) 492 is connected to the pre_outn output, where both of these second switches 490 and 492 are connected to ground. The up switches 484 and 490 are responsive to an input signal, such as the CLK2 signal of FIG. 14. The down switches 486 and 492 are responsive to a different input signal, such as the CLK1 signal or CLK3 signal as shown in FIG. 14.

In operation, the duty cycle detector 480 closes the up switches 484 and 490 and opens the down switches 486 and 492 when the input CLK signal is high (e.g., creating a low CLK1 signal and a high CLK2 signal). This creates a current path 494, which causes the pre_outp node to charge and the pre_outn node to discharge. When the input CLK signal is low, the current path 496 is created. This causes the down switches 486 and 492 to be closed and the up switches 484 and 490 to be opened, which in turn causes the pre_outp node to discharge and the pre_outn node to charge. Thus, when the duty cycle of the input signal is greater than 50%, the charging time of the pre_outp output node is greater than the discharging time of the pre_outp node, and the discharging time of the pre_outn node is greater than the charging time of the pre_outn node. This causes the capacitor 488 to charge up, the pre_outp output signal to be high, and the pre_outn output signal to be low. Conversely, when the duty cycle of the input CLK signal is less than 50%, the charging time of the pre_outp output node is less than its discharging time, and the charging time of pre_outn is greater than its discharging time, causing the capacitor 488 to discharge, the pre_outp output signal to be low, and the pre_outn signal to be high.

The pre_outp and pre_outn signals are provided to the filter 456 and comparator 458 of the duty cycle detector 450 as shown in FIG. 14. The comparator 458 outputs a signal indicative of whether the pre_outp signal or the pre_outn signal is high, which in turn indicates whether the duty cycle is greater than 50% or less than 50%, respectively.

In the example of detector core 452, the down switches 486 and 492 are driven by an input signal (e.g., CLK1) and the up switches 484 and 490 are responsive to the same input signal that has been inverted (such as CLK 2). This causes a delay of one inverter between the clocks of the charging and discharging switches, which in turn may cause the charging and discharging of the circuit to be mismatched. In some embodiments, such as the example embodiment of FIG. 14, this mismatch can be reduced by using two detector cores 452 and 454 and connecting their outputs. In detector core 452, the charging (up) switches 484 and 490 are responsive to the CLK2 signal and the discharging (down) switches are responsive to the CLK1 signal, where the CLK2 signal is delayed more than the CLK1 signal. The parallel detector core 454 is driven by the reverse delay of clocks compared to core 452, such that the up switches 484 and 490 are responsive to the CLK2 signal and the down switches are responsive to the CLK3 signal that has been inverted from the CLK2 signal and thus the CLK3 signal has greater delay. Thus, the parallel core 454 compensates for the discharging signal being ahead of the charging signal in core 452, by providing the charging clock signal one inverter delay ahead of the discharging signal in core 454. This configuration allows a reduction in potential mismatch between the charging and discharging of a single detector core.

Figure 15B:
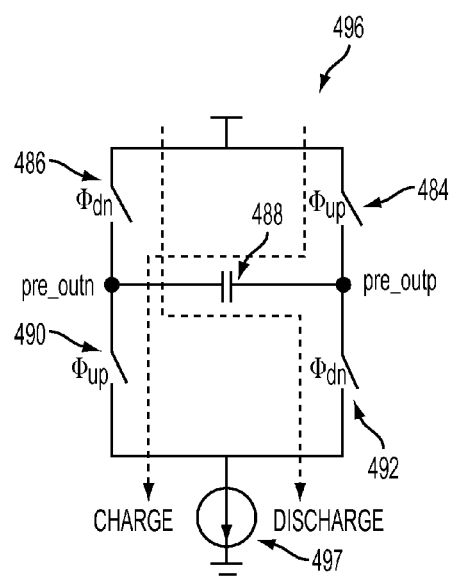

FIG. 15B illustrates another embodiment 496 showing a variation of the detector core 480 shown in FIG. 15A. In core 496, a current source 497 can be connected between ground and the switches 490 and 492, instead of current source 482 being connected between the voltage source and switches 486 and 484 as shown in FIG. 15A. In other embodiments, other variations can be used for the configuration of the detector core 480.

Figure 16:
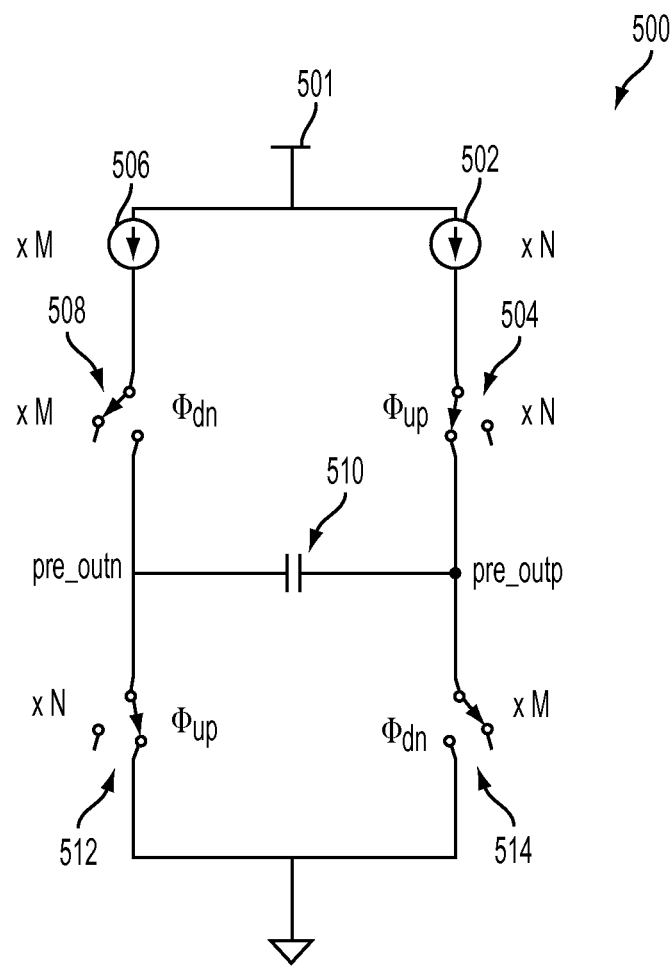
FIG. 16 is a schematic diagram of one embodiment of a detector core having a programmable duty cycle.

FIG. 16 is a schematic diagram of one embodiment 500 of a detector core having a programmable duty cycle. The detector core 500 allows a designer or user of the detector core to set a duty cycle other than 50%, which may be useful in particular embodiments requiring calibration to such a duty cycle.

Detector core 500 includes a voltage source 501 coupled to a current source 502, which is coupled in turn to a first up ($\phi_{up}$) switch 504. Voltage source 501 is also coupled to a current source 506, which is coupled to a first down ($\phi_{dn}$) switch 508. The first up switch 504 is coupled to one terminal of a capacitor 510 at a pre_outp node. The down switch 508 is coupled to the other terminal of capacitor 510 at a pre_outn node. A second up ($\phi_{up}$) switch 512 is coupled between the pre_outn node and ground, and a second down ($\phi_{dn}$) switch 514 is coupled between the pre_outp node and ground.

The detector core 500 can detect whether an input signal has a duty cycle greater than or less than a programmed target duty cycle. The programmed duty cycle is based on a ratio between the charging strength of pre-outp and the discharging strength of pre-outn. This charging and discharging strength is based on the magnitudes of the charging current and the discharging current (e.g., charge Q is equal to the current I multiplied by the time t). The charging current magnitude is based on the current source 502 and the resistance of the switches 504 and 512, while the discharging current magnitude is based on the current source 506 and the resistance of switches 508 and 514. By changing the current produced by one or more of the current sources 502 and 506 and/or changing the resistance of one or more of the switches, the programmable target duty cycle can be changed.

For example, if the ratio of the charging strength to the discharging strength is 2:3, then the charging time takes longer than the discharging time and will balance at a ratio of 3:2, causing detection of a duty cycle less than or greater than a target 60% duty cycle (3/(3+2)=60%). This changed ratio can be provided by changing the current output of a variable current source 502, or changing the current source 502 to a different source providing a reduced current compared to the current source 506. For example, in some embodiments, multiple current sources can be provided for each of the current source symbols 502 and 506, where one or more of the current sources can be selected for current output to provide the desired ratio and the desired target duty cycle. Alternatively or additionally, the resistance of one or more of the up switches 504 and 512 can be increased to have a similar effect. If a target duty cycle below 50% is desired for detection, then the current from current source 502 can be increased or the resistance decreased for one or more up switches 504 and 512.

Figure 17:
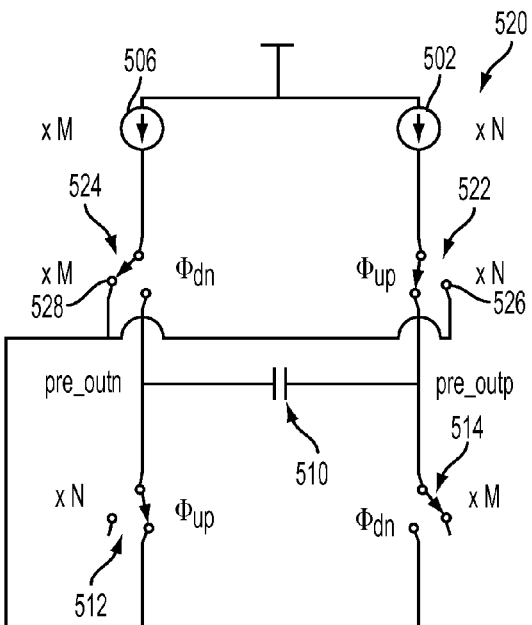
FIG. 17 is a schematic diagram of one embodiment of a detector core in which unused current is steered to ground.

FIG. 17 is a schematic diagram of one embodiment 520 of a detector core in which unused current is steered to ground. Detector core 520 is similar to detector core 500 of FIG. 16. However, in core 500, the up and down switches provide an open current path when the switches are open. When a switch is in a closed position and then opened, the current source(s) driving the current through the switch must stop their current output. Similarly, when a switch is in an open position and then closed, the current source(s) must start their current output. This repeating turning off and on of current sources causes undesired shutdown and start-up times for the current sources and has similar effects on the current magnitude.

In detector core 520, the first up switch 522 and the first down switch 524 are implemented such that when the switches are opened, the current is not stopped but is steered to ground. Up switch 522 includes a connection 526 in the open position which is connected to ground, and down switch 524 includes a connection 528 in the open position which is connected to ground. This allows the current from the current sources 502 and 506 to always be on, avoiding the effects of repeatedly shutting down and starting up the current sources during the charge and discharge cycle of the circuit.

Figure 18:
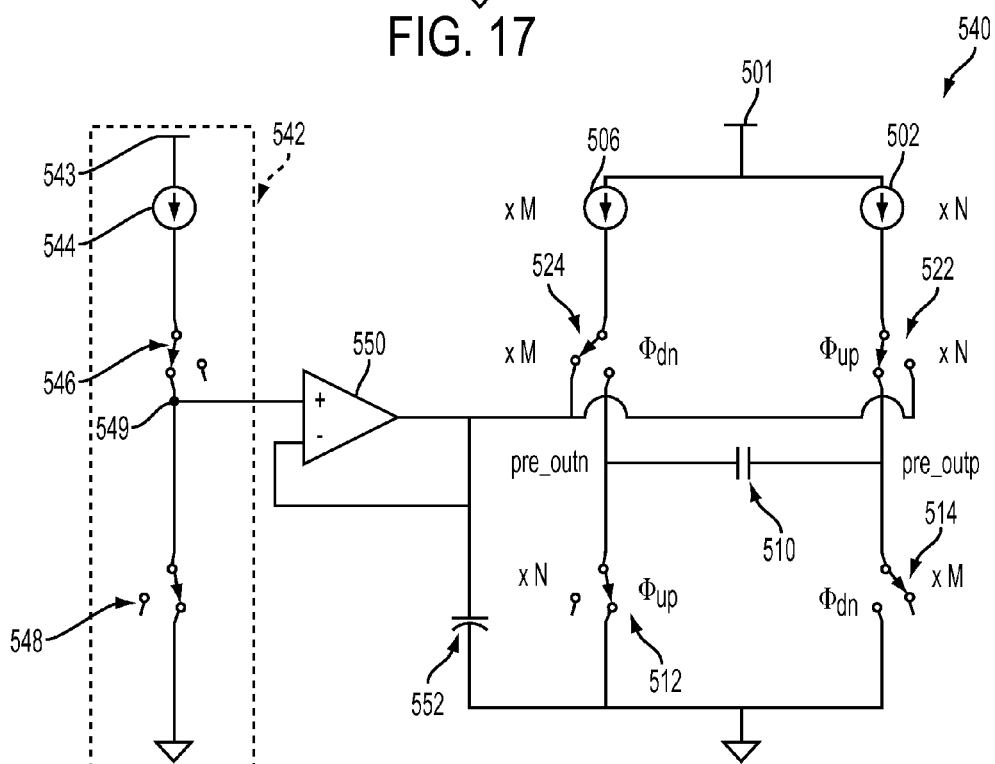
FIGS. 18-22 are schematic diagrams of alternate embodiments of a detector core in which unused current is steered to a biased node.

FIG. 18 is a schematic diagram of one embodiment 540 of a detector core in which unused current is steered to a biased node. In the embodiment 520 of FIG. 17, one disadvantage is that when a switch 522 or 524 is opened, the current is steered to ground. This causes the current source providing the current to have to adjust its output from a higher voltage when the switch was closed, to a ground voltage when the switch is opened.

In detector core 540, a bias is provided on the steered current path when the switch 522 or 524 is open. In this example embodiment, a replica circuit 542 includes a voltage source 543, a current source 544, a switch 546, and a switch 548 having certain ratio values and connections similar to working circuit components, such as voltage source 501, current source 502, switch 522, and switch 512, For example, the replica circuit can use the same ratio of component values as the working circuit. In some embodiments, the replica circuit component values can be reduced compared to the corresponding working circuit components in a particular ratio, e.g. 1/10, 1/16, or 1/32, to save power and size. The node 549 between the switches 546 and 548 is connected to a positive input of an operational amplifier 550. The output of amplifier 550 is connected to the open position terminals of switches 522 and 524. The output of the amplifier 550 is also connected to the negative input of the amplifier for feedback, and is connected to a tank capacitor 552 that is in turn connected to ground.

The replica circuit 542 creates a voltage bias at the open position of the switches 522 and 524 that is a replica of the voltage provided at the closed position of those switches. The tank capacitor 552 can have a large capacitance which acts as a low impedance buffer to absorb any additional current that may be provided through one of the switches 522 and 524 as compared to the other of these switches, thus preventing the voltage from increasing past the desired bias level. For example, extra or additional current may be provided to the capacitor 552 during a short time when one switch 522 is switching to one state and the other switch 524 is switching to the opposite state, such that both switches are briefly both connected to the open position. The capacitor 552 can gradually discharge the extra current. Similarly, the capacitor can provide charged current if, briefly during switching, neither of switches are connected to the open position.

The operational amplifier 550 acts as a buffer to prevent the replica voltage from being pulled from its desired level, and the closed feedback loop causes the difference between the positive input and the output of the amplifier 550 to be small. The bias voltage created by the replica circuit 542 at the open position of the switches 522 and 524 is at about the middle point of the working range of the circuit, and is higher than the ground bias provided in FIG. 17. This reduces the amount of change in current output required by the current sources 502 and 506 when either of the switches are opened.

Figure 19:
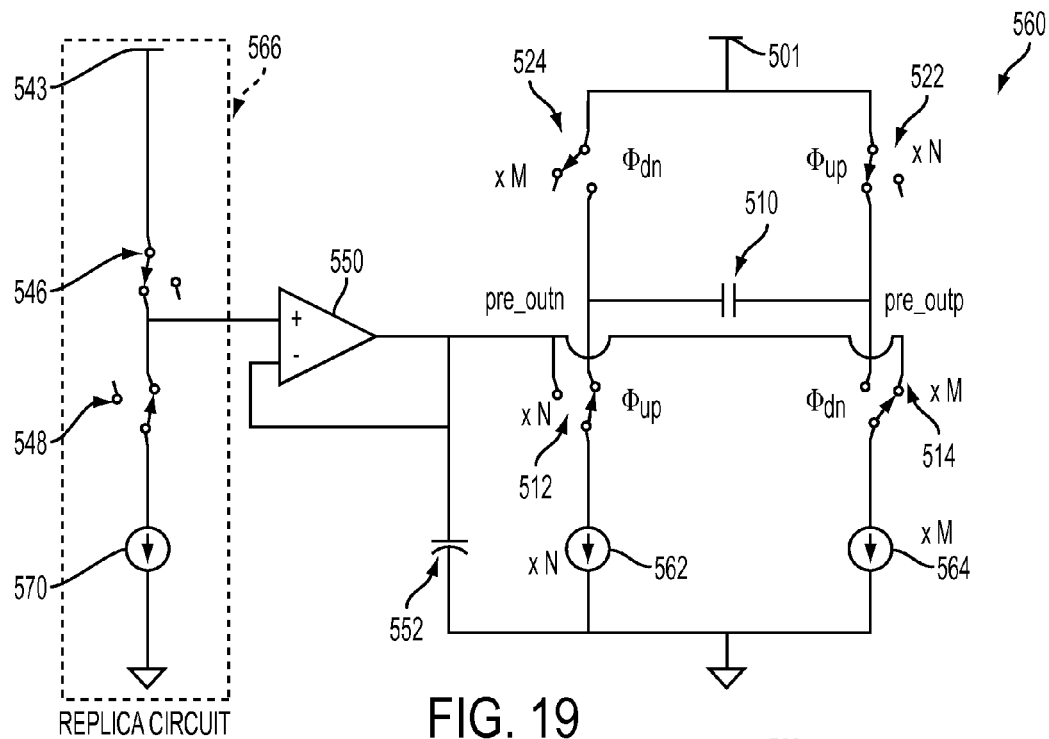

FIG. 19 is a schematic diagram of another embodiment 560 of a detector core in which unused current is steered to a biased node. This embodiment is similar to embodiment 540 of FIG. 18, except that sinking current sources are used instead of sourcing current sources. Thus, up switch 522 is coupled between the voltage source 501 and the pre_outp node, and down switch 524 is coupled between the voltage source 501 and the pre_outn node. The up switch 512 is coupled to the pre_outn node and a current source 562 is coupled to the up switch 512 and ground. The down switch 514 is coupled to the pre_outp node and a current source 564 is coupled to the down switch 514 and ground. A replica circuit 566 includes the switch 546 coupled to the voltage source 543, the switch 548 coupled to the switch 546, and a current source 570 coupled to the switch 548 and to ground. The operation of circuit 560 is similar to circuit 540 of FIG. 18, except that current is steered from the switches 512 and 514 in the open position instead of from the switches 522 and 524.

Figure 20:
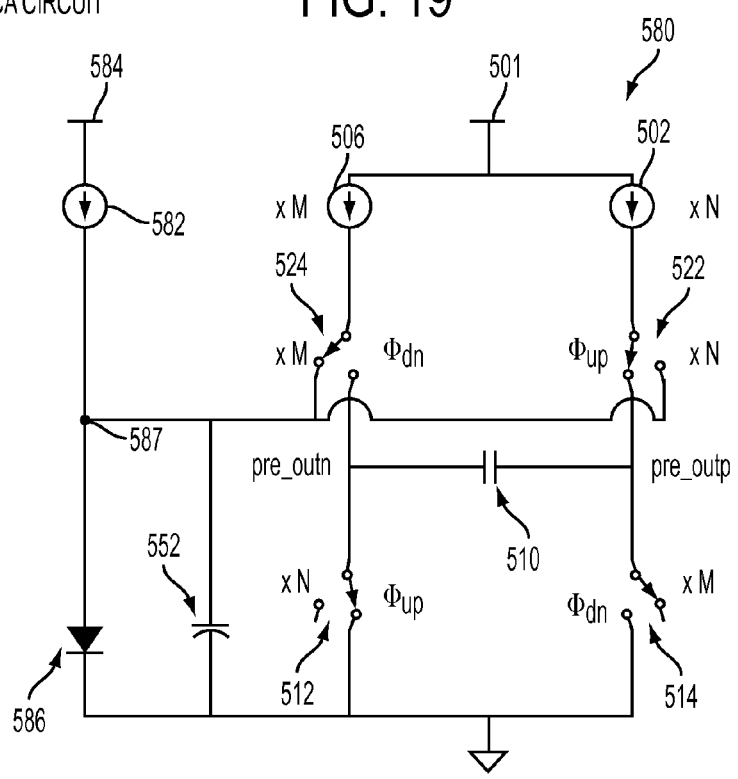

FIG. 20 is a schematic diagram of another embodiment 580 of a detector core in which unused current is steered to a biased node. This embodiment is similar to embodiment 540 of FIG. 18, except that a diode driven by a current source is used instead of a replica circuit. A current source 582 is connected to a voltage source 582, and a diode 586 is connected to the current source 582 and to ground, allowing current to flow to ground. The open positions of the up switch 522 and the down switch 524 are connected to the node 587 between the current source 582 and the diode 586. The diode 586 can be a true diode, or can be a diode-connected transistor device (e.g., a bipolar transistor having the collector connected to the base, or a MOS device having drain connected to gate).

In some embodiments, the diode 586 provides an approximately 0.7 volt DC bias at the open positions of the switches 522 and 524, which can be near the middle of the voltage range of the circuit (in some embodiments) and provide less difference in voltage for driving current when opening and closing the switches 522 and 524. Extra or additional current is provided to the capacitor 552, and the capacitor 552 gradually can discharge through the diode 586. For example, such extra current may be present during a short time when one switch 522 is turned on or off and the other switch 524 is turned to the opposite state, and when the two switches are both connected to the open position. Similarly, the capacitor can provide current when, during switching, neither of switches are connected to the open position.

Figure 21:
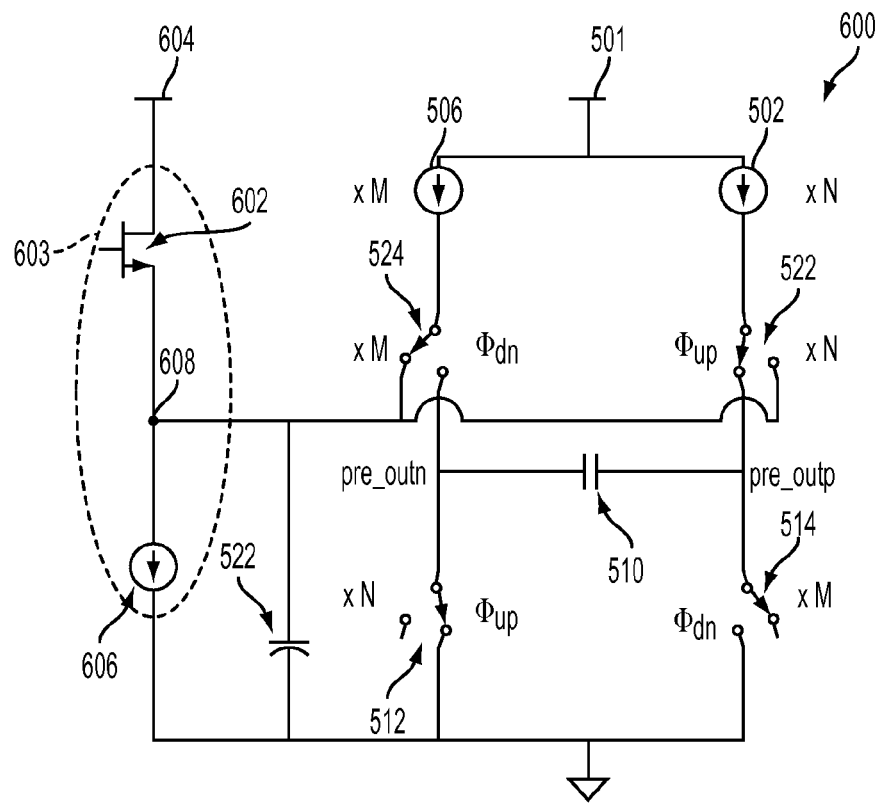

FIG. 21 is a schematic diagram of another embodiment 600 of a detector core in which unused current is steered to a biased node. In this embodiment, a source follower can be used to provide the low impedance DC bias instead of the diode 586 of FIG. 20. For example, instead of using current source 582 and diode 586, a source follower transistor 602 can be connected by its drain to a voltage source 604, and the source of the transistor can be connected to a sinking current source 606 that is connected to ground, thus forming the source follower 603. The open positions of the switches 522 and 524 can be connected to a node 608 between the source follower transistor 602 and the current source 606. The source follower can provide a DC bias at the open position node 608 based on the voltage drop of the source follower transistor 602, e.g., at about the middle voltage of the operating range of the circuit.

Figure 22:
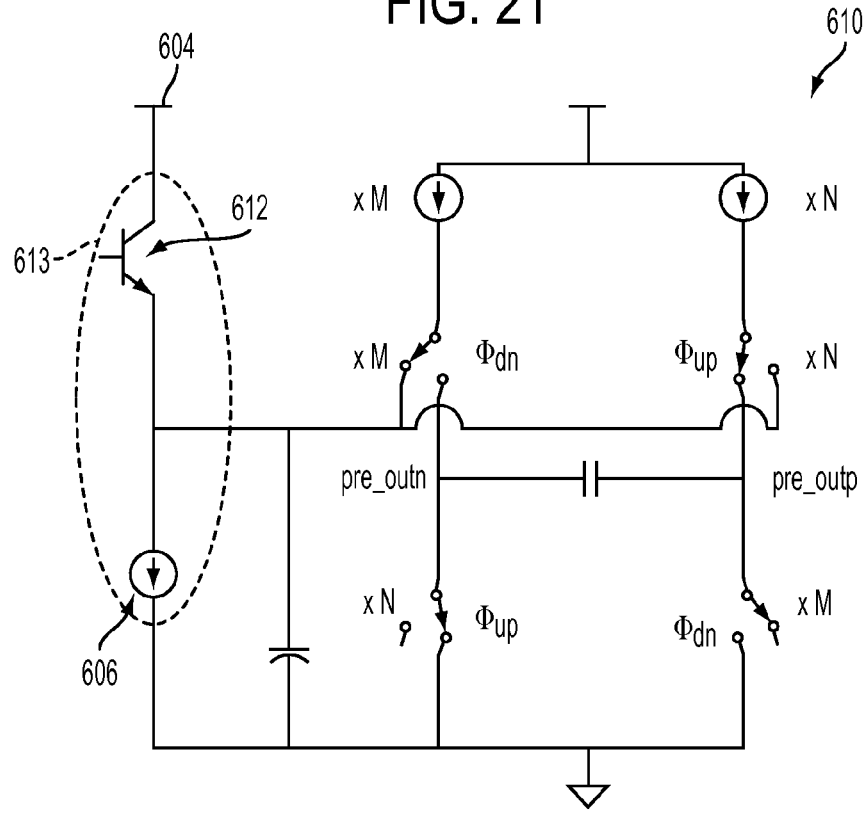

FIG. 22 is a schematic diagram showing another embodiment 610 similar to the embodiment of FIG. 21, in which the source follower transistor 602 of FIG. 21 is replaced by an emitter follower transistor 612 between voltage source 604 and sinking current source 606, forming an emitter follower 613.

In some embodiments of the duty cycle detector 16 having a programmable target duty cycle, as in embodiments shown in FIGS. 16-22, the duty cycle can be programmed using less components. Providing components needed to allow a large range of programmable target duty cycles and ratios may make some circuit embodiments costly and/or bulky. Some components may be able to be removed in some embodiments by changing the polarity of particular connections shown in the duty cycle detector shown in FIG. 14.

For example, in some embodiments the designer may wish to provide detection of a target duty cycle of (100%−X) rather than X, where X is a programmed duty cycle of the detector. In the embodiments described above, components may be provided to enable this range of target duty cycles, such as multiple current sources for each of the current source symbols 502 and 506. The desired current source and/or switches can be selected for use to re-configure the core ratio settings to achieve the 100−X duty cycle.

In another embodiment, the clock signals provided to the detector cores 452 and 454 can instead be switched. For example, the CLK1 signal can be input to the up switches and the CLK2 signal can be input to the down switches of the detector core 452. In addition, the CLK2 signal can be input to the up switches and the CLK3 signal can be input to the down switches of the detector core 454. This reverses the target duty cycle. For example, a 70% target duty cycle would become a 30% duty cycle. In some embodiments, additional inverters 451 can be added to invert the clock signals to achieve these core inputs.

In another embodiment, the inputs to the comparator 458 can be switched so that the outp signal is input to the negative input of the comparator and the outn signal is input to the positive input of the comparator. This provides a result of a target duty cycle of (100−X). These embodiments allow a larger range of target duty cycles without having to provide as many current sources to achieve the desired ratio of charge or currents.

It should be noted that the order of steps shown in the methods described above are only examples. In other embodiments, a different order of steps can be used, or some steps can be performed simultaneously, depending on preference or implementation.

Although the present embodiments have been described in accordance with the examples shown, one of ordinary skill in the art will readily recognize that there could be variations to the embodiments and those variations would be within the spirit and scope of the present inventions. Accordingly, many modifications may be made by one of ordinary skill in the art without departing from the spirit and scope of the appended claims.

What is claimed is:

1. A duty cycle calibration system comprising:
   a first tuning circuit operative to receive an input signal, tune a duty cycle of the input signal to within a first error range, and provide a first output signal;
   a second tuning circuit operative to receive the first output signal, tune a duty cycle of the first output signal to within an error range that is within a sub-gate delay, and provide a second output signal;
   a duty cycle detector operative to receive the second output signal and provide a duty cycle detection signal indicative of a duty cycle of the second output signal; and
   logic operative to control the first tuning circuit and the second tuning circuit based upon the duty cycle detection signal.

2. The duty cycle calibration system of claim 1 wherein the first tuning circuit comprises a coarse tuning circuit and the first error range is within a two gate delay, and wherein the second tuning circuit comprises a fine tuning circuit.

3. The duty cycle calibration system of claim 1 wherein the logic is operative to control a delay applied to the input signal in the first tuning circuit based on the duty cycle detection signal.

4. The duty cycle calibration system of claim 1 wherein the second tuning circuit changes an impedance in the second tuning circuit based on the duty cycle detection signal, the change in impedance causing a change in a rise time or fall time of edges of the first output signal and producing the second output signal having a tuned duty cycle.

5. The duty cycle calibration system of claim 1 wherein the duty cycle detector comprises a charging-discharging duty cycle detector, wherein if the second output signal has a duty cycle greater than the target duty cycle, a charging time is longer than the discharging time, and wherein if the second output signal has a duty cycle lower than the target duty cycle, the charging time is shorter than the discharging time.

6. A duty cycle calibration system comprising:
   a coarse tuning circuit operative to receive an input signal, tune a duty cycle of the input signal closer to a target duty cycle, and output a tuned output signal, wherein the tuned output signal is based on a combination of the input signal and a delayed signal that has been delayed relative to the input signal;
   a duty cycle detector operative to receive the tuned output signal and provide a duty cycle detection signal indicative of a duty cycle of the tuned output signal; and
   logic operative to control the coarse tuning circuit based upon the duty cycle detection signal
   wherein the coarse tuning circuit includes a circuit operative to:
   output the tuned output signal as one of a logical AND and a logical OR of the input signal and the delayed signal if the duty cycle of the input signal is over a predetermined target duty cycle, and
   output the tuned output signal as the other of the logical AND and the logical OR of the input signal and the delayed signal if the duty cycle of the input signal is less than a target duty cycle.

7. The duty cycle calibration system of claim 6 wherein the logic controls a delay of the delayed signal based upon the duty cycle detection signal.

8. The duty cycle calibration system of claim 6 wherein the coarse tuning circuit is operative to tune the duty cycle of the input signal to within a predetermined error range that is within a two gate delay.

9. The duty cycle calibration system of claim 6 wherein the tuning of the duty cycle includes outputting the tuned output signal based on a combination of an amplitude level of the input signal and an amplitude level of the delayed signal.

10. The duty cycle calibration system of claim 6 wherein the tuning of the duty cycle includes outputting edges of the tuned output signal based on rising or falling edges of the input signal and of the delayed signal.

11. The duty cycle calibration system of claim 10 wherein the coarse tuning circuit includes a circuit operative to:
    output the tuned output signal having edges based on the delayed signal and one of the falling and rising edges of the input signal, in response to the duty cycle of the input signal being over a predetermined target duty cycle, and
    output the tuned output signal having edges based on the delayed signal and the other of the falling and rising edges of the input signal, in response to the duty cycle of the input signal being less than a target duty cycle.

12. The duty cycle calibration system of claim 6 further comprising:
    a plurality of inverters connected in series, wherein each of the inverters provides an additional delay to the input signal, and wherein a plurality of inverter output signals are each output from a different one of the inverters; and
    a multiplexer receiving the plurality of inverter output signals and outputting one of the inverter output signals as the delayed signal.

13. The duty cycle calibration system of claim 12 further comprising a multiplexer delay structure connected to the input signal, wherein the multiplexer delay structure provides a delay to the input signal about equal to a delay provided by the multiplexer to the delayed signal.

14. The duty cycle calibration system of claim 6 further comprising a bypass path for the input signal allowing the input signal to be directly output as the tuned output signal in response to having a duty cycle equal to the target duty cycle.

15. A duty cycle calibration system comprising:
    a fine tuning circuit operative to receive an input signal, tune a duty cycle of the input signal closer to a target duty cycle, and output a tuned output signal, wherein the tuning of the duty cycle includes changing an impedance in the fine tuning circuit to change the rise time or fall time of edges of the tuned output signal;
    a duty cycle detector operative to receive the tuned output signal and provide a duty cycle detection signal indicative of a duty cycle of the tuned output signal; and logic operative to control the fine tuning circuit based upon the duty cycle detection signal.

16. The duty cycle calibration system of claim 15 wherein the logic controlling the fine tuning circuit includes changing the impedance in the second tuning circuit based on the duty cycle detection signal.

17. The duty cycle calibration system of claim 16 wherein changing the impedance is performed by adjusting a resistance of a variable resistor, or by adjusting a number of transistor devices coupled to the circuit, or by adjusting a current magnitude provided by a current source of the fine tuning circuit.

18. The duty cycle calibration system of claim 15 wherein the fine tuning circuit is operative to tune the duty cycle of the input signal to within an error range that is within a sub gate delay.

19. The duty cycle calibration system of claim 15 wherein the fine tuning circuit includes:
   a first transistor coupled between an input line;
   a first variable resistor coupled to the first transistor, wherein the first variable resistor contributes to the changeable impedance and is coupled to an input of an inverter;
   a second variable resistor coupled to the first variable resistor and to the input of the inverter, wherein the second variable resistor contributes to the changeable impedance; and
   a second transistor coupled between the input line and the second variable resistor.

20. The duty cycle calibration system of claim 15 wherein changing an impedance in the fine tuning circuit includes increasing the rise time of rising edges of the tuned output signal to reduce the duty cycle of the input signal, or increasing the fall time of falling edges of the tuned output signal to increase the duty cycle of the input signal.

* * * * *